(12) United States Patent
Flautner et al.

(10) Patent No.: US 7,533,226 B2
(45) Date of Patent: *May 12, 2009

(54) DATA PROCESSOR MEMORY CIRCUIT

(75) Inventors: Krisztian Flautner, Cambridge (GB);
David T. Blaauw, Ann Arbor, MI (US);
Trevor N. Mudge, Ann Arbor, MI (US);
Nam S. Kim, Ann Arbor, MI (US);
Steven M. Martin, Ann Arbor, MI (US)

(73) Assignees: ARM Limited, Cambridge (GB);
University of Michigan, Ann Arbor, MI (US)

( * ) Notice: Subject to any disclaimer, the term of this patent is extended or adjusted under 35 U.S.C. 154(b) by 0 days.

This patent is subject to a terminal disclaimer.

(21) Appl. No.: 11/353,024

(22) Filed: Feb. 14, 2006

(65) Prior Publication Data
US 2006/0253666 A1 Nov. 9, 2006

Related U.S. Application Data

(63) Continuation of application No. 10/410,602, filed on Apr. 10, 2003, now Pat. No. 7,055,007.

(51) Int. Cl.
*G06F 12/00* (2006.01)
(52) U.S. Cl. ...................................................... 711/156
(58) Field of Classification Search ................. 711/137, 711/156; 365/189.09, 203, 227, 228, 229; 713/323, 324
See application file for complete search history.

(56) References Cited

U.S. PATENT DOCUMENTS

| 5,627,412 | A | | 5/1997 | Beard |
| 6,015,738 | A | * | 1/2000 | Levy et al. ................... 438/275 |
| 2003/0128607 | A1 | * | 7/2003 | Miyashita et al. ........... 365/203 |

OTHER PUBLICATIONS

K. Nii et al, "A Low Power SRAM Using Auto-Backgate-Controlled MT-CMOS" *Proc. of the International Symposium on Low Power Electronics and Design*, 1998, pp. 293-298.
M. Powell et al, "Gated-$V_{dd}$: A Circuit Technique to Reduce Leakage in Deep-Submicron Cache Memories" *Proc. of the International Symposium on Low Power Electronics and Design*, 2000, pp. 90-95.

(Continued)

*Primary Examiner*—Hiep T Nguyen
(74) *Attorney, Agent, or Firm*—Nixon & Vanderhye P.C.

(57) ABSTRACT

A memory circuit for use in a data processing circuit is described, in which memory cells have at least two states, each state being determined by both a first voltage level corresponding to a first supply line and a second voltage level corresponding to a second supply line. The memory circuit comprises a readable state in which information stored in a memory cell is readable and an unreadable state in which information stored in said memory cell is reliably retained but unreadable. Changing the first voltage level but keeping the second voltage level substantially constant effects a transition between the readable state and the unreadable state. In use, the static power consumption of the memory cell in the unreadable state is less than static power consumption of the memory cell in the readable state.

56 Claims, 29 Drawing Sheets

OTHER PUBLICATIONS

Silicore Corporation, "SLC1657 8-Bit RISC uC Core" Technical Reference Manual, pp. 1-194.
Synthesizable VHDL source code file representing the TOPLOGIC Entity used in "SLC1657 8-Bit RISC uC Core".
Synthesizable VHDL source code file representing the STRATSREG Entity used in "SLC1657 8-Bit RISC uC Core".
Synthesizable VHDL source code file representing the RESETGEN Entity used in "SLC1657 8-Bit RISC uC Core".
Synthesizable VHDL source code file representing the PROGCNTR Entity used in "SLC1657 8-Bit RISC uC Core".
Synthesizable VHDL source code file representing the REG12CRN Entity used in "SLC1657 8-Bit RISC uC Core".

* cited by examiner

| Level 1 data cache 32K, 4-way, 32byte line, window size = 2000 cycles | | | | | | |
|---|---|---|---|---|---|---|
| Working set | Number of accesses | Accesses per line | Accesses per cycle | Fraction of accesses same as in the $n^{th}$ previous window | | |
| | | | | n=1 | n=8 | n=32 |
| crafty | 17.6% | 1250.56 | 6.95 | 0.63 | 65.2% | 54.9% | 49.3% |
| vortex | 10.8% | 1209.07 | 10.89 | 0.60 | 54.3% | 29.0% | 31.0% |
| bzip | 5.9% | 1055.84 | 17.35 | 0.53 | 32.5% | 19.7% | 17.2% |
| vpr | 9.2% | 1438.69 | 15.27 | 0.72 | 62.2% | 46.9% | 45.6% |
| mcf | 8.9% | 1831.68 | 20.05 | 0.92 | 61.0% | 60.8% | 60.4% |
| parser | 8.7% | 971.73 | 10.85 | 0.49 | 46.9% | 34.6% | 28.4% |
| gcc | 8.1% | 809.69 | 9.78 | 0.40 | 36.9% | 24.9% | 21.1% |
| facerec | 10.4% | 970.04 | 9.15 | 0.49 | 37.4% | 27.5% | 33.6% |
| equake | 7.0% | 1513.27 | 21.09 | 0.76 | 92.8% | 91.4% | 90.7% |
| mesa | 8.0% | 1537.09 | 18.69 | 0.77 | 83.8% | 76.8% | 74.5% |

FIG. 7

| | Awake tags | | | | Drowsy tags | | | |
|---|---|---|---|---|---|---|---|---|
| | Normalized total energy | | Normalized leakage energy | Run-time increase | Normalized total energy | | Normalized leakage energy | Run-time increase |
| | DVS | Theoretical min. | DVS | Theoretical min. | | DVS | Theoretical min. | DVS | Theoretical min. | |
| ammp | 0.25 | 0.11 | 0.24 | 0.09 | 0.66% | 0.20 | 0.05 | 0.18 | 0.03 | 1.33% |
| applu | 0.47 | 0.36 | 0.33 | 0.20 | 0.42% | 0.43 | 0.32 | 0.28 | 0.14 | 0.84% |
| apsi | 0.46 | 0.36 | 0.30 | 0.17 | 0.06% | 0.43 | 0.32 | 0.25 | 0.11 | 0.22% |
| art | 0.39 | 0.27 | 0.32 | 0.19 | 0.66% | 0.35 | 0.22 | 0.27 | 0.13 | 1.32% |
| bzip2 | 0.45 | 0.34 | 0.26 | 0.12 | 0.59% | 0.41 | 0.30 | 0.21 | 0.06 | 1.23% |
| crafty | 0.53 | 0.44 | 0.34 | 0.22 | 0.45% | 0.50 | 0.41 | 0.29 | 0.16 | 0.92% |
| eon | 0.55 | 0.47 | 0.32 | 0.19 | 0.40% | 0.52 | 0.43 | 0.27 | 0.13 | 0.64% |
| equake | 0.50 | 0.41 | 0.27 | 0.13 | 0.08% | 0.47 | 0.37 | 0.21 | 0.06 | 0.20% |
| facerec | 0.46 | 0.36 | 0.29 | 0.15 | 0.46% | 0.42 | 0.31 | 0.24 | 0.09 | 0.87% |
| fma3d | 0.41 | 0.30 | 0.26 | 0.12 | 0.10% | 0.37 | 0.25 | 0.20 | 0.05 | 0.08% |
| galgel | 0.52 | 0.42 | 0.37 | 0.25 | 0.34% | 0.49 | 0.39 | 0.32 | 0.19 | 0.69% |
| gap | 0.52 | 0.43 | 0.28 | 0.14 | 0.26% | 0.49 | 0.40 | 0.22 | 0.08 | 0.63% |
| gcc | 0.43 | 0.32 | 0.28 | 0.14 | 0.65% | 0.39 | 0.27 | 0.23 | 0.08 | 1.25% |
| gzip | 0.46 | 0.36 | 0.28 | 0.14 | 0.83% | 0.43 | 0.32 | 0.22 | 0.07 | 1.87% |
| lucas | 0.43 | 0.32 | 0.25 | 0.11 | 0.04% | 0.39 | 0.27 | 0.20 | 0.05 | 0.12% |
| mcf | 0.55 | 0.46 | 0.28 | 0.15 | 0.11% | 0.52 | 0.42 | 0.23 | 0.08 | 0.22% |
| mesa | 0.51 | 0.42 | 0.27 | 0.14 | 0.14% | 0.48 | 0.38 | 0.22 | 0.07 | 0.30% |
| mgrid | 0.47 | 0.36 | 0.33 | 0.20 | 0.52% | 0.43 | 0.32 | 0.28 | 0.14 | 0.97% |
| parser | 0.46 | 0.35 | 0.28 | 0.15 | 1.03% | 0.42 | 0.31 | 0.23 | 0.08 | 2.09% |
| sixtrack | 0.48 | 0.38 | 0.31 | 0.18 | 0.33% | 0.44 | 0.34 | 0.26 | 0.11 | 0.65% |
| swim | 0.40 | 0.28 | 0.30 | 0.16 | 0.56% | 0.36 | 0.24 | 0.24 | 0.10 | 1.14% |
| twolf | 0.40 | 0.28 | 0.27 | 0.13 | 0.69% | 0.35 | 0.23 | 0.22 | 0.07 | 1.48% |
| vortex | 0.49 | 0.39 | 0.30 | 0.16 | 0.29% | 0.46 | 0.35 | 0.24 | 0.10 | 0.60% |
| vpr | 0.51 | 0.42 | 0.29 | 0.15 | 0.51% | 0.48 | 0.38 | 0.23 | 0.09 | 1.25% |
| wupwise | 0.36 | 0.24 | 0.24 | 0.09 | 0.07% | 0.31 | 0.18 | 0.18 | 0.02 | 0.13% |
| Average | 0.46 | 0.35 | 0.29 | 0.15 | 0.41% | 0.42 | 0.31 | 0.24 | 0.09 | 0.84% |

FIG. 14

Simulation parameters.

| Parameters | Value |
|---|---|
| fetch/issue/decode/commit | 4 instructions |
| fetch queue / speed | 4 instructions / 1x |
| branch prediction | bimodal, 2k |
| BTB | 512 entry, 4-way |
| RAS | 8 entry |
| RUU size | 64 entry |
| LSQ size | 32 entry |
| integer ALUs/multi-divs | 4 / 1 |
| floating point ALUs / mul-div | 1 / 1 |
| memory bus width / latency | 8 bytes / 80 and 8 cycles for the first and inter chunks |
| inst. / data TLBs | 16 entry / 32 entry in each way, 4KB page size, 4-way, LRU, 30-cycle latency |
| L1 caches | 16KB ~ 64KB, 1~4-way, 32B blocks, LRU, 1 cycle latency, write-back |
| L2 unified cache | 256KB, 4-way, 64B line block, LRU, 8 cycle latency |

FIG. 24

| SPEC 2000 | prediction buffers (%) | | | | | | | | | tag predictor (%) | | |
|---|---|---|---|---|---|---|---|---|---|---|---|---|
| | 32 entry | | | 64 entry | | | 128 entry | | | | | |
| | 16k | 32k | 64k | 16k | 32k | 64k | 16k | 32k | 64k | 16k | 32k | 64k |
| bzip200 | 95 | 91 | 91 | 99 | 95 | 95 | 100 | 96 | 96 | 84 | 67 | 85 |
| eon00 | 45 | 43 | 41 | 47 | 44 | 42 | 55 | 52 | 50 | 70 | 71 | 70 |
| gcc00 | 45 | 42 | 41 | 54 | 51 | 50 | 62 | 59 | 59 | 55 | 68 | 60 |
| parser00 | 86 | 86 | 87 | 88 | 85 | 86 | 85 | 78 | 78 | 73 | 83 | 76 |
| twolf00 | 56 | 54 | 44 | 73 | 72 | 63 | 80 | 82 | 79 | 72 | 75 | 81 |
| vpr00 | 53 | 58 | 56 | 59 | 61 | 60 | 78 | 77 | 76 | 81 | 79 | 82 |
| crafty00 | 38 | 32 | 32 | 54 | 52 | 51 | 59 | 58 | 59 | 56 | 68 | 69 |
| gap00 | 64 | 65 | 64 | 67 | 68 | 66 | 73 | 70 | 72 | 73 | 76 | 79 |
| gzip00 | 82 | 82 | 72 | 69 | 62 | 86 | 100 | 100 | 75 | 54 | 73 | 51 |
| mcf00 | 73 | 46 | 42 | 78 | 80 | 82 | 78 | 80 | 78 | 83 | 79 | 82 |
| vortex00 | 41 | 37 | 35 | 53 | 48 | 44 | 57 | 57 | 54 | 52 | 63 | 64 |
| ammp00 | 85 | 84 | 84 | 88 | 89 | 87 | 95 | 92 | 92 | 76 | 71 | 81 |
| applu00 | 93 | 97 | 98 | 93 | 97 | 98 | 93 | 97 | 98 | 90 | 98 | 97 |
| art00 | 100 | 100 | 100 | 100 | 100 | 100 | 100 | 100 | 100 | 92 | 97 | 93 |
| equake00 | 46 | 43 | 39 | 75 | 73 | 72 | 82 | 82 | 84 | 77 | 86 | 85 |
| galgel00 | 97 | 97 | 97 | 97 | 97 | 97 | 97 | 97 | 97 | 97 | 97 | 97 |
| lucas00 | 100 | 100 | 100 | 100 | 100 | 100 | 100 | 100 | 100 | 75 | 83 | 83 |
| mesa00 | 63 | 60 | 56 | 75 | 73 | 68 | 88 | 86 | 87 | 73 | 85 | 83 |
| mgrid00 | 99 | 98 | 98 | 99 | 99 | 99 | 99 | 99 | 99 | 99 | 89 | 99 |
| avg | 72 | 69 | 67 | 77 | 76 | 76 | 83 | 82 | 81 | 76 | 79 | 80 |

FIG. 26

Run-time increases of direct-mapped caches for SPEC 2000 benchmarks.

TABLE 28A

| SPEC 2000 | no prediction (%) | | | prediction buffers (%) | | | | | | | | | tag predictor (%) | | |
|---|---|---|---|---|---|---|---|---|---|---|---|---|---|---|---|
| | | | | 32 entry | | | 64 entry | | | 128 entry | | | | | |
| | 16k | 32k | 64k | 16k | 32k | 64k | 16k | 32k | 64k | 16k | 32k | 64k | 16k | 32k | 64k |
| bzip200 | 0.8 | 0.8 | 0.8 | 0.1 | 0.2 | 0.1 | 0.0 | 0.1 | 0.1 | 0.0 | 0.0 | 0.0 | 0.2 | 0.4 | 0.4 |
| eon00 | 6.1 | 7.0 | 7.2 | 4.1 | 4.4 | 4.2 | 3.9 | 4.4 | 4.4 | 2.9 | 3.3 | 3.4 | 2.0 | 3.0 | 3.2 |
| gcc00 | 1.9 | 2.3 | 2.3 | 1.1 | 1.5 | 1.6 | 0.9 | 1.3 | 1.4 | 0.8 | 1.0 | 1.1 | 0.8 | 1.1 | 1.1 |
| parser00 | 1.2 | 1.2 | 1.3 | 0.2 | 0.2 | 0.3 | 0.2 | 0.2 | 0.2 | 0.2 | 0.2 | 0.2 | 0.3 | 0.7 | 0.7 |
| twolf00 | 2.8 | 3.0 | 3.0 | 0.9 | 1.2 | 1.2 | 0.5 | 0.8 | 0.8 | 0.3 | 0.5 | 0.4 | 0.5 | 0.6 | 0.7 |
| vpr00 | 4.7 | 5.3 | 5.3 | 2.1 | 2.1 | 2.0 | 1.6 | 1.7 | 1.7 | 0.7 | 0.7 | 0.8 | 1.2 | 1.2 | 1.6 |
| crafty00 | 3.7 | 5.2 | 4.3 | 2.3 | 3.8 | 3.1 | 1.5 | 2.7 | 2.5 | 1.3 | 2.3 | 2.2 | 1.6 | 2.0 | 2.2 |
| gap00 | 3.5 | 3.7 | 3.7 | 1.6 | 1.6 | 1.8 | 1.3 | 1.3 | 1.4 | 1.0 | 1.2 | 1.0 | 1.0 | 1.1 | 1.0 |
| gzip00 | 0.9 | 0.9 | 2.4 | 0.5 | 0.5 | 0.6 | 0.5 | 0.6 | 0.1 | 0.0 | 0.0 | 0.5 | 0.1 | 0.9 | 1.8 |
| mcf00 | 5.0 | 8.7 | 9.7 | 0.9 | 3.4 | 3.7 | 0.5 | 0.7 | 0.2 | 0.5 | 0.7 | 0.4 | 1.0 | 1.5 | 1.9 |
| vortex00 | 5.4 | 8.6 | 3.2 | 2.8 | 3.7 | 1.5 | 2.0 | 3.0 | 3.1 | 0.2 | 5.1 | 2.6 | 1.0 | 2.4 | 2.6 |
| ammp00 | 0.1 | 0.2 | 0.2 | 0.0 | 0.0 | 0.0 | 0.0 | 0.0 | 0.0 | 0.0 | 0.0 | 0.0 | 0.0 | 0.0 | 0.0 |
| applu00 | 0.1 | 0.1 | 0.1 | 0.0 | 0.0 | 0.0 | 0.0 | 0.0 | 0.0 | 0.0 | 0.0 | 0.0 | 0.0 | 0.0 | 0.0 |
| art00 | 0.1 | 0.1 | 0.1 | 0.0 | 0.0 | 0.0 | 0.0 | 0.0 | 0.0 | 0.0 | 0.0 | 0.0 | 0.0 | 0.0 | 0.0 |
| equake00 | 9.0 | 10.6 | 12.5 | 5.4 | 6.0 | 6.9 | 1.4 | 1.6 | 1.9 | 0.5 | 0.6 | 0.6 | 2.1 | 1.6 | 1.8 |
| galgel00 | 0.1 | 0.1 | 0.1 | 0.0 | 0.0 | 0.0 | 0.0 | 0.0 | 0.0 | 0.0 | 0.0 | 0.0 | 0.0 | 0.0 | 0.0 |
| lucas00 | 4.2 | 4.2 | 4.2 | 0.0 | 0.0 | 0.0 | 0.0 | 0.0 | 0.0 | 0.0 | 0.0 | 0.0 | 2.0 | 1.1 | 1.1 |
| mesa00 | 5.9 | 5.5 | 5.0 | 2.1 | 2.4 | 2.2 | 1.4 | 1.5 | 1.2 | 0.4 | 0.4 | 0.3 | 1.4 | 1.8 | 1.3 |
| merid00 | 0.0 | 0.0 | 0.0 | 0.0 | 0.0 | 0.0 | 0.0 | 0.0 | 0.0 | 0.0 | 0.0 | 0.0 | 0.0 | 0.0 | 0.0 |
| avg | 1.5 | 1.8 | 1.6 | 0.7 | 0.8 | 0.7 | 0.5 | 0.6 | 0.5 | 0.3 | 0.5 | 0.4 | 0.3 | 0.4 | 0.3 |

Leakage energy reduction of direct-mapped caches for SPEC 2000 benchmarks.

TABLE 28B

| SPEC 2000 | no prediction (%) | | | prediction buffers (%) | | | | | | | | | tag predictor (%) | | |
|---|---|---|---|---|---|---|---|---|---|---|---|---|---|---|---|
| | | | | 32 entry | | | 64 entry | | | 128 entry | | | | | |
| | 16k | 32k | 64k | 16k | 32k | 64k | 16k | 32k | 64k | 16k | 32k | 64k | 16k | 32k | 64k |
| bzip200 | 69 | 81 | 86 | 69 | 81 | 86 | 69 | 81 | 86 | 69 | 81 | 86 | 69 | 84 | 86 |
| eon00 | 67 | 79 | 85 | 68 | 80 | 86 | 68 | 80 | 86 | 68 | 80 | 86 | 68 | 84 | 86 |
| gcc00 | 69 | 80 | 86 | 69 | 80 | 86 | 69 | 80 | 86 | 69 | 80 | 86 | 69 | 84 | 86 |
| parser00 | 69 | 80 | 86 | 69 | 81 | 86 | 69 | 81 | 86 | 69 | 81 | 86 | 69 | 84 | 86 |
| twolf00 | 68 | 80 | 86 | 69 | 80 | 86 | 69 | 80 | 86 | 69 | 81 | 86 | 69 | 84 | 86 |
| vpr00 | 68 | 80 | 86 | 68 | 80 | 86 | 69 | 80 | 86 | 69 | 81 | 86 | 69 | 84 | 86 |
| crafty00 | 68 | 80 | 86 | 68 | 80 | 86 | 69 | 80 | 86 | 69 | 80 | 86 | 69 | 84 | 86 |
| gap00 | 68 | 80 | 86 | 69 | 80 | 86 | 69 | 80 | 86 | 69 | 80 | 86 | 69 | 84 | 86 |
| gzip00 | 69 | 80 | 86 | 69 | 81 | 86 | 69 | 81 | 86 | 69 | 81 | 86 | 69 | 84 | 86 |
| mcf00 | 68 | 79 | 85 | 69 | 80 | 86 | 69 | 81 | 86 | 69 | 81 | 86 | 69 | 84 | 86 |
| vortex00 | 67 | 79 | 86 | 68 | 80 | 86 | 68 | 80 | 86 | 69 | 80 | 86 | 69 | 84 | 86 |
| ammp00 | 69 | 81 | 86 | 69 | 81 | 86 | 69 | 81 | 86 | 69 | 81 | 86 | 69 | 84 | 86 |
| applu00 | 69 | 81 | 86 | 69 | 81 | 86 | 69 | 81 | 86 | 69 | 81 | 86 | 69 | 84 | 86 |
| art00 | 69 | 81 | 86 | 69 | 81 | 86 | 69 | 81 | 86 | 69 | 81 | 86 | 69 | 84 | 86 |
| equake00 | 66 | 79 | 85 | 67 | 79 | 85 | 69 | 80 | 86 | 69 | 81 | 86 | 58 | 84 | 86 |
| galgel00 | 69 | 81 | 86 | 69 | 81 | 86 | 69 | 81 | 86 | 69 | 81 | 86 | 69 | 84 | 86 |
| lucas00 | 68 | 80 | 86 | 69 | 81 | 86 | 69 | 81 | 86 | 69 | 81 | 86 | 68 | 84 | 86 |
| mesa00 | 67 | 80 | 86 | 68 | 80 | 86 | 68 | 80 | 86 | 69 | 81 | 86 | 69 | 84 | 86 |
| merid00 | 69 | 81 | 86 | 69 | 81 | 86 | 69 | 81 | 86 | 69 | 81 | 86 | 69 | 84 | 86 |
| avg | 69 | 80 | 86 | 69 | 80 | 86 | 69 | 81 | 86 | 69 | 81 | 86 | 69 | 84 | 86 |

FIG. 28

DATA PROCESSOR MEMORY CIRCUIT

This application is a Continuation of application Ser. No. 10/410,602, filed Apr. 10, 2003 now U.S. Pat. No. 7,055,007, the entire content of which is incorporated herein by reference.

The U.S. Government has a paid-up license in this invention and the right in limited circumstances to require the patent owner to license others on reasonable terms as provided for by the terms of F33615-00-C-1678 awarded by Defense Advanced Research Projects Agency.

BACKGROUND OF THE INVENTION

1. Field of the Invention

The present invention relates to memory circuits for data processing. More particularly, this invention relates to reducing static power consumption in such memory circuits.

2. Description of the Prior Art

Complementary metal-oxide semiconductor (CMOS) transistors are the current technology of choice for most data processors due to their advantageous characteristic of consuming power only when switching. When not switching, individual CMOS transistors consume a negligible amount of power ($\sim 10^{-15}$ Amps for N-type or P-type transistor) although the cumulative leakage current for modern data processors which have high transistor densities is becoming more and more significant as component sizes shrink and transistor densities increase ($\sim 10^{-6}$ Amps). It is estimated that static power consumption currently accounts for 15% to 20% of the total power on chips implemented in high-speed processes.

The total power consumption in a CMOS circuit includes a dynamic power component, $P_{dynamic}$, due to switching activity and a static power component, $P_{static}$, arising from transistor leakage current. $P_{dynamic}$ has a contribution from each switching event of $CV_{dd}^2 f$, where C is the gate output capacitance and f is the processor clock frequency. Whereas $P_{static} = I_{leakage} V_{dd}$, where: $I_{leakage}$ is the total chip leakage current and is proportional to $e^{(-Vt/T)}$; T is the temperature; and $V_{dd}$ is the power-supply voltage. Accordingly, as $V_t$ decreases $I_{leakage}$ rises dramatically.

Reduced power supply voltages have accompanied decreasing feature dimensions in successive generations of silicon process technologies. These reduced supply voltages have tended to offset the impact of increasing transistor counts and increasing clock frequencies on dynamic power. As power supply voltages decrease, it is necessary to decrease transistor threshold voltages $V_t$ to maintain fast switching speeds and sufficient noise margins. However reduced power supply voltages $V_{dd}$ result in increased static power consumption.

FIG. 1 of the accompanying drawings is a graph of normalized leakage power against minimum transistor gate length in µm ($10^{-6}$ m) for four different temperatures. The data were obtained from a circuit simulation. This graph illustrates that as processor technology moves below 0.1 micron, static power consumption, if left unchecked, is set to increase exponentially and could conceivably dominate the total power consumption of the central processing unit (CPU).

One known technique to reduce static power consumption is the gated-$V_{DD}$ technique as introduced in M. Powell et.al. "*Gated-Vdd: A circuit technique to reduce leakage in deep submicron cache memories*", Proc. Of Int. Symp. Low Power Electronics and Design, 2000, pp.90-95. Memory circuits of this type are settable to either a full-power mode or a low-leakage mode. The gated-$V_{DD}$ technique reduces the leakage power by employing a high threshold (high-$V_t$) transistor to turn off the power to the memory cell when the cell is set to a low-leakage mode. This high-$V_t$ device drastically reduces the leakage of the circuit because of the exponential dependence of leakage current on $V_t$. Although the gated-$V_{DD}$ technique is very effective at reducing leakage current, its main disadvantage lies in that it loses any information stored in the memory cell when switched into low-leakage mode. In the case of an on-chip (L1) cache memory circuit this means that the lost data must be reloaded from off-chip (L2) cache if the data is to be retrieved and this tends to negate energy savings as well as incurring a significant performance penalty. To avoid these drawbacks, gated-$V_{DD}$ schemes must use complex adaptive algorithms and be conservative about which arrays of memory cells (such as cache lines) are turned off.

A second known technique for reduction of static power consumption is adaptive body-biasing with multi-threshold CMOS (ABB-MTCMOS) as described in K. Nii, et. al. "*A low power SRAM using auto-backgate-controlled MT-CMOS*", Proc. of Int. Symp. Low Power Electronics and Design, 1998, pp. 293-298. Again, each cell of this memory circuit is settable to either a full-power mode or a low-leakage mode. In this case the low-leakage mode does not involve completely switching off power to the transistors, rather transistors are set to a low-power "drowsy mode" in which leakage power is reduced. The drowsy mode is implemented by dynamically increasing the threshold voltage of the transistor memory cells. This paper by Nii et. al., discloses an static random access memory (SRAM) circuit in which an active mode is achieved by setting a first virtual source line to 1.0V (via a first PMOS transistor) whilst a second virtual supply line is forced to ground level (via an NMOS transistor). In the active mode the voltage source is set at 1.0V. This can be contrasted with a sleep mode where the first virtual source line is set to the higher value of 2.3V whilst the second virtual source line is also increased from ground to 1.0V. In sleep mode the voltage source is increased to 3.3V and two pairs of diodes are used (each diode having a forward bias of 0.5V) to obtain the 2.3V and 1.0V virtual supply levels. Although the leakage current through the memory cell is reduced significantly in this ABB-MTCMOS scheme, the necessary increase in the supply voltage of the circuit in sleep mode acts to offset some of the gain derived from the reduction in total static power consumption. Accordingly the leakage power in the low-leakage mode is much higher than that achievable by switching off the transistors.

Furthermore, this ABB-MTCMOS technique requires that the voltages of both the power and ground supply lines in addition to the voltage of the N-wells are changed each time the circuit enters or exits drowsy mode. The substantial N-well capacitance of the PMOS devices increases the energy required to switch the cache memory cell to high-power mode and can also significantly increase the time needed to transition to/from drowsy mode. Since the ABB-MTCMOS technique involves changing the substrate voltages of the PMOS transistors it would be very difficult to implement other than on a cell by cell basis in memory. Similarly to the above-described gated-$V_{DD}$ technique, ABB-MTCMOS requires special high-$V_t$ devices for the control logic.

Accordingly, there is a need for a memory circuit that offers better leakage power reduction and faster switching than ABB-MTCMOS type circuits yet is simple to implement (e.g. line by line in cache memory) and retains cell information in the low-leakage mode.

SUMMARY OF THE INVENTION

Viewed from one aspect the present invention provides a memory circuit for use in a data processing apparatus, in which memory cells have at least two states, each state being determined by both a first voltage level corresponding to a first supply line and a second voltage level corresponding to a second supply line, said memory circuit comprising:

a readable state in which information stored in a memory cell is readable; and an unreadable state in which information stored in said memory cell is retained but unreadable;

wherein a transition between said readable state and said unreadable state is effected by changing said first voltage level but keeping said second voltage level substantially constant and wherein, in use, static power consumption of said memory cell in said unreadable state is less than static power consumption of said memory cell in said readable state.

Viewed from another aspect the present invention provides a computer program product bearing a computer program for controlling a memory circuit having a plurality of memory cells, each of said plurality of memory cells having a readable state in which information stored in a memory cell is readable and an unreadable state in which information stored in said memory cell is retained but unreadable, said computer program comprising:

resetting code operable to reset at least one of said plurality of memory cells from said readable state to said unreadable state in dependence upon a reset time.

Viewed from yet another aspect the present invention provides memory access prediction circuitry operable to predict which region of a memory circuit will next be accessed during execution of program code by a processor, said memory circuit having a plurality of memory cell arrays each memory cell array having a respective plurality of memory cells that are collectively settable to said readable state or said unreadable state, said memory access prediction circuitry comprising:

identifying logic operable to identify a transition instruction in said program code, said transition instruction being associated with a transition between said processor accessing a currently active memory region and said processor accessing a next target memory region of said memory circuit;

storage means operable to storing a transition address, said transition address corresponding to said transition instruction and to store in relation to said transition address a respective region identifier that identifies said next target memory region;

comparator logic operable to check said stored transition address on each processor access to said memory circuit to determine if a current program instruction corresponds to said transition address;

wake-up logic operable to initiate a transition of said next target memory region from said unreadable state to said readable state in dependence upon a result of said check of said stored transmission address.

The invention recognises that a state transition between a full-power mode and a low-leakage mode can be achieved using simplified circuitry by changing a single supply voltage level. This is simpler to implement than known methods that allow retention of the cell information in the low-power mode, which require changes to two supply voltages as well as the transistor substrate voltage to each memory cell. The information stored in the memory cell can be retained in the low-leakage mode yet static power consumption can be significantly reduced in comparison to known implementations of drowsy mode states by reducing the supply voltage in the unreadable state (low-leakage mode).

Although memory cells of the memory circuit need only have two possible states i.e. a readable state and an unreadable state, preferred embodiments involve the possibility of setting each memory cell to a further state which is an off-state. In the off-state, static power leakage is drastically reduced but information stored in the cell must be reloaded when it is reinstated to the readable state. This has the advantage of providing a more flexible system, in which each memory cell has three possible states so that balancing of static power reduction and performance penalties can be more finely tuned according to the memory array access history.

Although memory cells may be set to the readable state or the unreadable state on a cell by cell basis, it is preferred that memory cell arrays comprising a plurality of memory cells are collectively settable to the readable state or the unreadable state. This has the advantage of simplifying the control circuitry and mirroring the block-by-block or line-by-line co-ordination of data read/write processes in known data processor memory circuits such as RAM or cache.

Although, only the data storing portions of each memory array need be settable to the low-leakage unreadable mode to achieve static power reduction, it is preferred that in the context of a cache memory the tag memory portion associated with a memory array is also settable to the unreadable mode. This has the advantage of providing further reduced static power consumption by the memory circuit. This is particularly advantageous for use in direct mapped caches where the further reduction in static power consumption is achieved without any adverse impact on performance.

In preferred embodiments, the supply voltage level of the memory array is controlled in dependence upon the value of a readable-status bit (or "drowsy bit"). This has the advantage of simplifying the control mechanisms responsible for switching between the low-leakage state and the full power state so that, for example, only two additional transistors than the traditional memory array need be provided to effect the unreadable mode.

Although there are many alternative strategies that could be used to determine which of the plurality of memory cells in a memory circuit are set to unreadable mode at any one time, for example, based on a sophisticated tracking and analysis of the access history of each individual memory array or of groups of memory arrays. In one preferred embodiment a simple policy is used, which involves periodically setting each and every memory array to drowsy mode according to a predetermined reset time. Following each reset, only those memory arrays for which a read request is received will be restored to the readable state. This policy has the advantages that memory cells are aggressively set to drowsy mode thereby ensuring greater static power loss and it obviates the need for sophisticated memory access analysis and control algorithms yet results in surprisingly little overall access speed reduction.

In a further preferred embodiment the mode controller is operable to reset to drowsy mode, only those memory cell arrays that have not been accessed in a predetermined time interval. This has the advantage of reducing the performance impact by decreasing the number of memory arrays that have to be reinstated to full power mode in comparison to a more aggressive policy yet allowing for a simple control policy requiring only basic tracking of memory access history.

Advantageously, the mode controller is operable to calculate a performance penalty for setting each memory array into unreadable mode. This allows for more deterministic control of the trade-off between reduction in static power consumption which is increased as more memory cells are set to unreadable mode and the performance penalty incurred by having to reinstate memory cells to full power when information stored therein is required.

In a preferred embodiment, memory cell transistors of the memory's internal inverters are coupled to read/write lines of the memory circuit via a pass-transistor having a substantially higher threshold voltage than the associated cell transistors. This has the advantage of significantly reducing leakage through the pass transistors when the read/write lines are maintained in high-power mode.

In a further preferred embodiment, the memory circuit is arranged such that the capacitance of the voltage supply rail (which supplies voltage $V_{dd}$) is substantially less than the capacitance of pass-transistor. This has the advantage that it reduces the switching time for the transition between the readable state and the unreadable state, allowing for shorter switching times than achievable using techniques that involve increasing the threshold voltage of the memory cell transistors.

There are several alternative ways of allowing for cell information to be retained in the low-leakage mode. However, preferred embodiments achieve this objective by providing a memory circuit in which, in the unreadable state the first voltage (i.e. the supply voltage $V_{dd}$) is to set to be substantially 1.5 times the threshold voltage associated with the memory cell transistors. This provides for straightforward implementation of memory retention in the unreadable state.

Advantageously, in preferred embodiments transitions between the readable state and the unreadable state are effected by changing the supply voltage from a high value in the readable state to a comparatively low value in the unreadable state. This has the advantage that the change to the supply voltage in switching from the readable state to the unreadable state does not offset any of the reduction in total power consumption derived from reduction of the total leakage power for cells in the unreadable state.

Preferred embodiments of the memory circuit include at least one memory array comprising circuitry, such as a simple logic gate, operable to prevent any accesses to the memory array when it is in an unreadable state. This has the advantage of ensuring that the information stored in the memory cell is not destroyed in the event that memory cell access is attempted when the supply voltage of the drowsy cache line is lower than the pre-charge voltage of a read/write line.

The memory circuit according the invention could be used to reduce static power consumption in a variety of different memory types, for example in off-chip cache memory (L2 cache), random access memory (RAM), synchronous dynamic random access memory (SDRAM), tightly coupled memory (TCM), which is on-chip memory intended to store a predetermined portion of the most critical code/data associated with an application, or in other memory structures such as branch predictors. However, it is particularly advantageously used in static random access memory (SRAM) such as L1 (on-chip) cache memory because L1 cache memory typically comprises a significant proportion of a processor's transistors so that the leakage current in L1 cache is comparatively high.

The above, and other objects, features and advantages of this invention will be apparent from the following detailed description of illustrative embodiments which is to be read in connection with the accompanying drawings.

BRIEF DESCRIPTION OF THE DRAWINGS

FIG. 7 is a table that lists cache line access characteristics for a number of benchmark software applications;

FIG. 14 is a table of data providing a comparison of the energy savings made by implementing the simple policy with a window size of 4000 cycles, with and without the use of drowsy tags;

FIG. 24 is a table I that lists simulation parameters;

FIG. 26 is a table giving the detailed simulation results (associated with FIGS. 25A and 25B) for the sub-bank predictor accuracy of direct-mapped caches for SPEC 2000 benchmarks;

FIG. 28 lists two tables giving detailed experimental results for run-time increases and for leakage power reduction for SPEC 2000 benchmarks;

DESCRIPTION OF THE PREFERRED EMBODIMENTS

Figure 2:
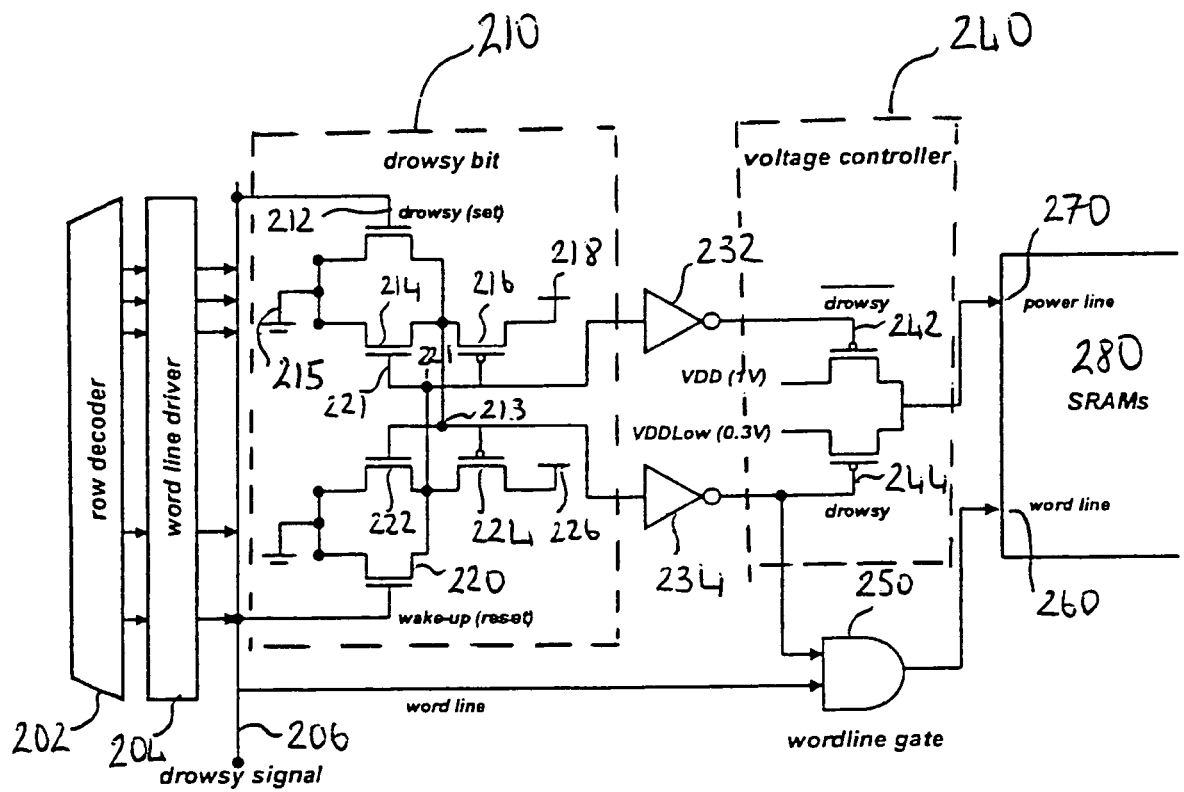
FIG. 2 schematically illustrates a dynamic voltage scaling (DVS) circuit for a drowsy cache line according to an embodiment of the invention.

FIG. 2 schematically illustrates a dynamic voltage scaling (DVS) circuit for a drowsy cache line according to one example embodiment of the invention. The circuit comprises: a row decoder 202; a word line driver 204, a drowsy signal line 206; a drowsy bit control circuit 210 a first NMOS/PMOS series-connected transistor pairs 214, 216 and a second such pair 222, 224, a drowsy (set) NMOS transistor 212 and a wake-up (reset) NMOS transistor 220; a pair of inverter gates 232, 234; a voltage controller comprising two PMOS pass transistors 242 and 244, one of which 242 is connected to a high-voltage line and the other of which 244 is connected to a low-voltage line; a word-line AND gate 250; and an SRAM memory circuit 280 which receives as input a power line 270 and a word line 260 from the drowsy bit circuitry.

The operating voltage of an array of memory cells in SRAM (a cache line) is determined by the voltage controller 240, which switches the array voltage between a high (active) supply voltage and a low (drowsy) supply voltage in dependence upon the state of the drowsy bit. In particular, when the drowsy bit is a logical '1', the supply voltage will correspond to the low-voltage (unreadable) state whereas of the drowsy bit is a logical '0', the supply voltage will correspond to the high-voltage (readable) state. The way in which this is achieved by the circuit elements of FIG. 2 will now be outlined.

An NMOS transistor will only conduct when its input (via the transistor gate) is a logical '1' whereas a PMOS transistor will only conduct when its input is a logical '0'. If the signal on the drowsy signal line corresponds to a logical '1' then the drowsy set NMOS 212 will be conducting and will provide a path from ground 215 to the input node 213 of NMOS/PMOS transistor pair 222, 224. Accordingly a logical '0' is supplied as input to transistors 222 and 224 whereupon PMOS 224 will be conducting but NMOS 222 will be non-conducting. When PMOS 224 is conducting there is a path from voltage source 226 to PMOS 244 via the inverter gate 234. Since a logical '1' is input to the inverter gate 234 a logical '0' is supplied to the gate of PMOS 244 which switches the low (0.3V) voltage supply to the power line 270 of the SRAM circuit 280. Thus the SRAM memory circuit that is supplied by the power line 270 is set to drowsy mode.

The word line driver controls the input to the wake-up NMOS 220. A logical '1' will be supplied as input to NMOS 220 when a read request for a word-line has been received. If the input to the gate of wake-up NMOS 220 is a logical '1' then the transistor 220 will conduct providing a path from ground to the input node 221 of the NMOS/CMOS transistor pair 214, 216. A logical '0' input to this transistor pair renders NMOS 214 non-conducting and PMOS 216 conducting so that there is a path from voltage source 218 to the PMOS transistor 242 via the inverter gate 232. Since the input to the inverter gate 232 is a logical '1', the output of the inverter 232 which is supplied to the gate of PMOS 242 is a logical 'zero'. Accordingly, PMOS 242 is conducting and provides a path from the high (1.0V) voltage supply to the power line 270. Accordingly the SRAM 280 memory cells supplied by the power line 270 are set (or reinstated) to readable mode.

The word line AND gate 250 will only allow a word line (i.e. address line) to be read from SRAM if the word line signal is a logical '1' and the output of the inverter gate 234 is also a logical '1'. The output of the inverter gate 234 cannot be a logical '1' when PMOS 244 is conducting. Accordingly, a read operation is prevented when the SRAM memory cells are set to the drowsy state. The word line AND gate 250 serves to prevent inadvertent loss of the memory cell contents by attempting to perform a read operation when the memory cell is in drowsy mode. Loss of cell contents could otherwise arise due to the voltage of the drowsy cache line being lower than the pre-charge voltage of the cache memory circuit bit line. Note that a read operation involves driving the bit line to the same state as a flip-flop of the SRAM memory cell when the word line 260 is active. Whenever a cache line is accessed, a cache controller (not shown) monitors the voltage state of the cache line by reading the drowsy bit. If the accessed line is in readable mode the contents of the cache line can be read without adversely affecting processing performance. No performance penalty is incurred because the drowsy bit is read concurrently with the standard process of reading and comparing an address tag of the read address supplied by the central processing unit (CPU) and the address tag labelling the data stored in cache memory. However if the memory array is in drowsy mode the cache line is not read immediately, since to attempt to read data with the cache line in drowsy (unreadable) mode may result in the loss of stored data. Instead a read instruction for a drowsy cache line results in a wake-up signal being sent via NMOS transistor 220 during the next clock cycle so that data can be read during subsequent cycles once the cache line has been reinstated to readable mode.

The circuit of FIG. 2 requires few additions in comparison to a standard cache line (six-transistor SRAM memory cell). The main additions to the standard cache memory circuit are the drowsy bit circuitry 210, the mechanism for controlling the supply voltage to memory cells 240 and the word-line gate 250. In order to support the drowsy mode the cache line circuit of FIG. 2 requires only two additional transistors (i.e. the set and reset transistors 212, 220) more than the standard memory circuit.

Figure 3:
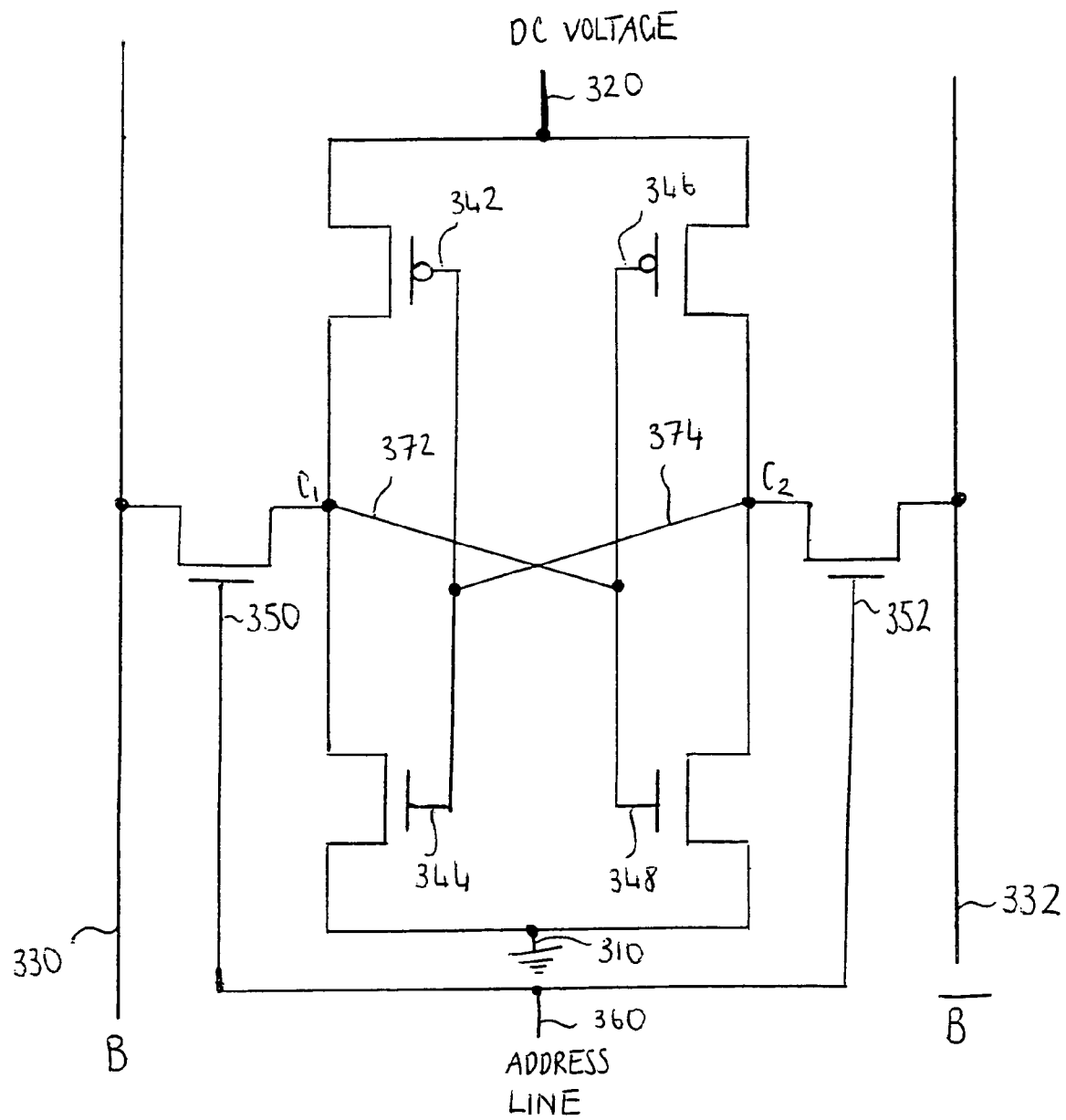
FIG. 3 schematically illustrates a known standard six-transistor per bit SRAM memory circuit.

FIG. 3 schematically illustrates a known standard six-transistor per bit SRAM memory circuit. The standard SRAM circuit includes a flip-flop circuit made up of a first inverter comprising series connected PMOS 342 and NMOS 344 transistors and a second inverter comprising series connected PMOS 346 and NMOS 348 transistors. The output of the first inverter is coupled to the input of the second inverter via a first cross-coupling 372 and similarly the output of the second inverter is coupled to the input of the first inverter via a second cross-coupling 374. The sources of the PMOS transistors 342, 346 are connected to a DC voltage supply 320 whereas the sources of the NMOS transistors 344, 348 are connected to ground 310. The SRAM circuit further comprises a bit line 330 and its complementary bit line 332, an address line (or word line) 360 and two NMOS address line transistors 350, 352 whose gate input voltages are determined by the signal on the address line 360. The NMOS address line transistor 350 couples the output of the first inverter 342, 344 to the bit line 330 whereas the NMOS address line transistor 352 couples the output of the second inverter 346, 348 to the complementary bit line 332.

The function of the SRAM flip-flop is simple. If the input to the second inverter (i.e. the signal $C_1$ on cross-coupling 372) is a logical '1' then NMOS 348 conducts providing a path to ground 310 so that the output $C_2$ of the second inverter is a logical '0'. Accordingly, the input of the first inverter is a logical '0' so that PMOS 342 conducts providing a path to the DC voltage 320 and the output of the first inverter is a logical '1'. The output equals the input so the latch is "transparent".

If the input to the second inverter is switched to a logical '0' then PMOS 346 conducts providing a path to the DC voltage 320 so that the input of the first inverter (equivalently the output of the second inverter) is a logical '1'. Accordingly, the NMOS 344 conducts, thereby providing a path to ground so that the output of the first inverter $C_1$ is a logical 'zero'. Thus the flip-flop arrangement has two stable logic states. A write operation involves sending a logical 1 or 0 on the signal bit line 330 and activating the address line 360. When the address line 360 is active the NMOS address line transistor 350 is conducting so the flip-flop is driven to a stable state that matches the bit line. A read operation also involves an active address line but in this case the bit line is driven to the same state as the flip-flop.

Figure 4:
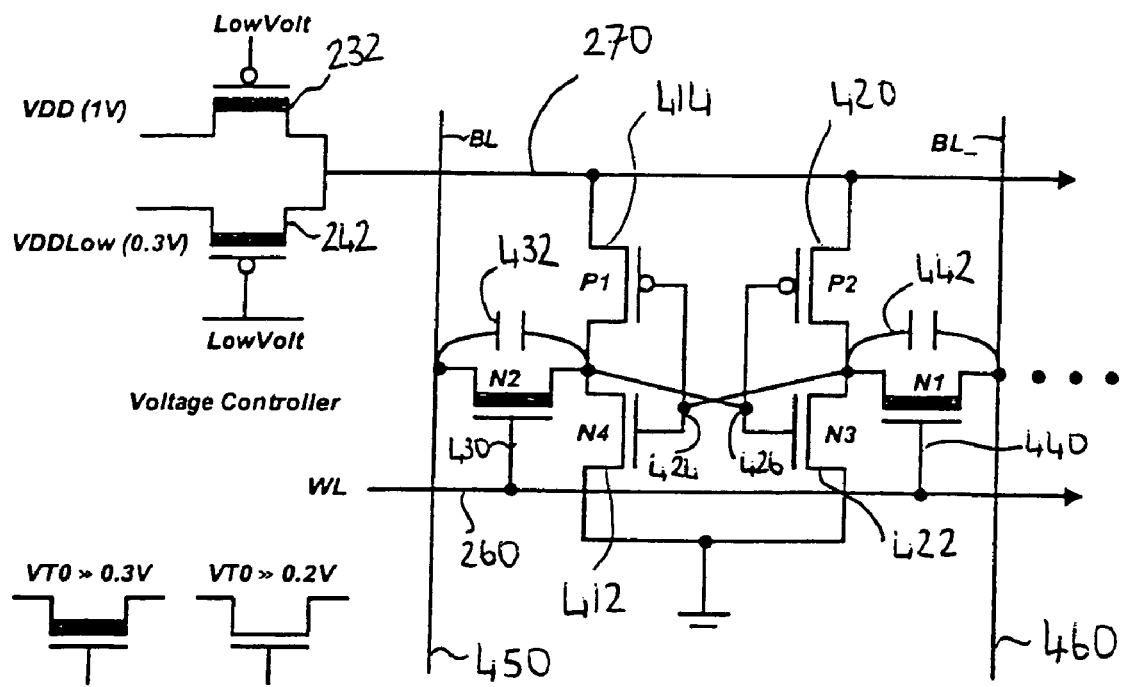
FIG. 4 schematically illustrates a DVS memory circuit according to an embodiment of the invention.

FIG. 4 schematically illustrates a dynamic voltage scaling (DVS) memory circuit according to one example embodiment of the invention. This memory circuit has a flip-flop transistor arrangement similar to that of the standard SRAM circuit illustrated in FIG. 3. Although FIG. 4 shows a single memory cell, this memory cell is only one of a plurality of such memory cells whose state is being controlled by the voltage controller 240. In this particular embodiment the voltage controller 240 is associated with a single cache line, the cache line comprising a plurality of memory cells. The circuit comprises a first inverter transistor consisting of NMOS transistor 412 and a PMOS transistor 414 and a second inverter transistor consisting of NMOS transistor 422 and a PMOS transistor 420. The first and second inverters are cross-coupled. The drains of the PMOS transistors 414, 420 are connected to the power line 270 whereas the sources of NMOS transistors 412, 422 are connected to ground.

The voltage controller PMOS transistors 232 and 242 determine the voltage of the power line 270. If the gate input to PMOS transistor 232 is a logical '0', then the high voltage (1V) power supply is selected. However, if the gate input to PMOS transistor 242 is a logical '0' then the low voltage (0.3V) power supply is selected and the memory cell is in the drowsy (unreadable) state. The output of the first inverter 412, 414 is coupled to a vertical bit line 450 via a first NMOS pass transistor 430. Similarly, the output of the second inverter 420, 422 is coupled to a vertical complementary bit line 460 via a second NMOS pass transistor 440. The input gate of each pass transistor is connected to the word line 260, which mediates read/write operations. The first pass transistor 430 has a first capacitance 432 and the second pass transistor 440 has a second capacitance 442.

Since the bit lines 450, 460 (i.e. read/write lines) are maintained in high power mode it is necessary to prevent leakage from the NMOS pass transistors 430, 440. This is achieved by giving NMOS pass transistors 430, 440 high voltage thresholds $V_t$. The power controller PMOS transistors 232, 242 are also high-$V_t$ transistors to prevent leakage from the high voltage (1.0V) supply to the low voltage (0.3V) supply. The circuit of FIG. 4 shows a single memory cell. A separate voltage controller is required for each cache line.

Figure 5:
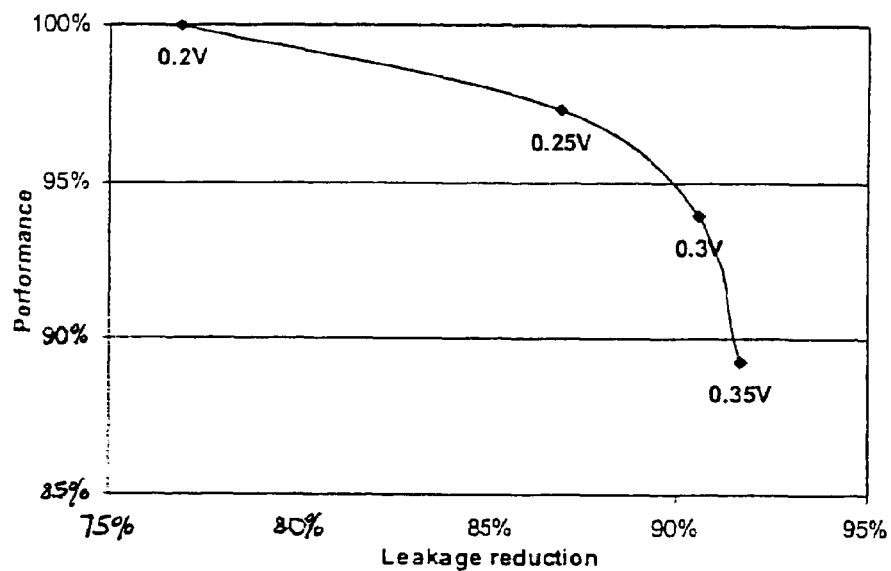
FIG. 5 schematically illustrates the leakage power reduction versus performance impact for several Vt values.

The high-Vt value for the NMOS pass transistors 430, 440 is determined by counterbalancing the leakage power reduction and the adverse performance impact of using a high-Vt device. FIG. 5 schematically illustrates the leakage power reduction versus performance impact for Vt values of 0.2V, 0.25V, 0.3V and 0.35V (as determined via computer simulations). Simulations using NMOS pass transistors with Vt=0.2V have shown that the portion of leakage power caused by the NMOS pass transistors is 16.78% and 71.77% for readable (high-power) and unreadable (low-power) supply voltage modes respectively. These values are quite significant. As the threshold voltage $V_t$ of the NMOS pass transistors is increased towards 0.35V, the leakage power decreases exponentially and it approaches the maximum reduction ratio (92.15%) that can be achieved. The maximum reduction ratio is achieved by completely eliminating leakage current through the NMOS pass transistor.

The performance degradation as a result of increasing Vt, can be estimated by measuring the delay from the word line 260 assertion to a point where there is a 50 mV voltage difference between two complementary bit lines 450, 460. This voltage difference corresponds to the known threshold for sense-amp activation. From the graph of FIG. 5 it is clear that the delay will increase as the threshold voltage $V_t$ is increased. However the fraction of the delay from the word line activation point to the sense-amp activation point has been calculated to amount to only about 22% of the sum total of delay factors that contribute to the total access time of the memory system.

In the embodiment of FIG. 4, a 0.3V high-Vt value of 0.3V was selected because, as is apparent from FIG. 5, it results in a sensible trade-off point between performance loss (6.05%) and current leakage reduction (91.98%). In alternative embodiments, the performance loss could be compensated for by carefully tuning the size of the access and cross-coupled inverter transistors. Although such size tuning may increase the dynamic power dissipation as a result of the increase in switching capacitance of the bit lines.

The memory circuit in FIG. 4 could potentially incur increased susceptibility to noise and could also be susceptible to the variation of $V_t$ across process corners. Since capacitive coupling of the lines is small, any increased susceptibility to noise can be corrected by careful circuit layout. The problem of variation of $V_t$ across process corners can be addressed by selecting a conservative high voltage ($V_{DD}$) value, such as $V_{DD}$=1V used in the embodiment of FIG. 4.

Figure 6:
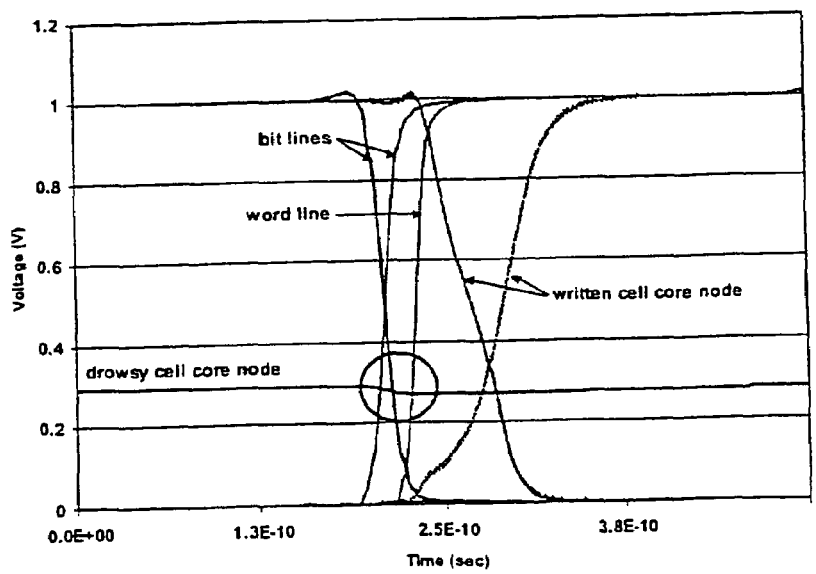
FIG. 6 schematically illustrates the cross-talk stability of a drowsy memory cell according to an embodiment of the invention.

FIG. 6 schematically illustrates the results of computer simulations that investigated the cross-talk stability of the DVS memory cell of FIG. 4 in the unreadable mode. The simulation involved performing a write operation to an adjacent memory cell sharing the same bit lines 450,460 as an unreadable mode cell but whose supply voltage corresponds to readable mode. The coupling capacitance and the large voltage swing across the bit lines would make the bit in the drowsy memory cell vulnerable to flipping if the dynamic voltage scaling memory circuit had a stability problem. However, it is clear from the simulation results of FIG. 6 that the state of the drowsy memory cell is indeed stable. There is only a slight fluctuation in the drowsy cell core node voltage caused by the signal cross-talk between the bit lines and the memory internal nodes (written cell core nodes). Furthermore, there is no cross-talk noise between the word line and the internal node voltage, because word line gating (via AND gate 250 in FIG. 2) prevents read accesses to drowsy mode memory cells. Although the voltage scaling technique according to embodiments of the invention has less immunity against a single event upset (SEU) from alpha radiation particles, this problem can be relieved by process techniques such as silicon on insulator (SOI). In any case, other static memory structures also suffer from this SEU problem.

The memory cell layout was created using TSMC (Taiwan Semiconductor Manufacturing Company Ltd) 0.18 μm technology, which was the smallest available feature size. The dimensions of the memory cell were 1.84 um by 3.66 um, whilst those for the voltage controller were 6.18 um by 3.66 um. It is estimated that the area overhead of the voltage controller is equivalent to 3.35 memory cells for a $64 \times L_{eff}$ (effective gate length) voltage controller. This relatively low area overhead can is achievable for this embodiment because the routing in the voltage controller is simple compared to the memory cell. The following (conservative) area overhead factors were assumed: 1.5 equivalent memory cells for the drowsy bit (the 0.5 factor arises from the two additional transistors 212, 220 for set and reset); a single equivalent memory cell for the control signal driver (two inverters 232, 234); and 1.5 equivalent memory cells for the wordline gating circuit 250. The total overhead is thus equivalent to 7.35 memory cells per cache line. The total area overhead is less than 3% for the entire cache line. To examine the effects of circuit stability and leakage power reduction, we applied a linear scaling technique to all extracted capacitances.

Table 1 below lists the advantages and disadvantages for the two traditional circuit techniques for leakage reduction as well as for the dynamic voltage scaling method (DVS) according to embodiments of the invention, and we show the power consumption for the three schemes in low-leakage mode. The leakage power in the gated-VDD method is very small compared to the other schemes. However, this technique does not preserve the state of the cache cell. Comparing the DVS technique as implemented in embodiments of the invention and known ABB-MTCMOS techniques, the DVS method reduces leakage power by a factor of 12.5, while the ABB-MTCMOS method reduces leakage by only a factor of 5.9.

Detailed power values for drowsy mode and normal-power mode for the DVS circuit are shown in Table 2 below. The energy parameters and drowsy transition time in the table correspond to a 32 KB four-way set associative cache (see explanation of set associative cache below with reference to FIG. 8) with 32 Wmin for the voltage controller switch size. In order to determine the time required to switch a cache line from drowsy (unreadable) mode to readable mode, the delay time of the supply lines was measured with HSPICE (circuit simulation tool) and the "Berkeley Predictive Model" (see http://www-device.eecs.berkeley.edu) for a 0.071 μm process. To measure the transition delay, a 32 KB memory cell array was connected to the supply voltage controllers and the capacitances of the supply voltage metal line and bit lines were estimated. The transition delay varies depending on the transistor width of the pass gate switch 232, 242 in the voltage controller. A $16 \times L_{eff}$ PMOS pass-transistor is needed for a two cycle transition delay. A single cycle transition delay can be obtained by increasing the width of this transistor to $64 \times L_{eff}$. The cycle time of the cache was estimated using the CACTI (Cache Access/Cycle Time) model with supported process scaling. It was found that the access time of the cache is 0.57 ns and that the transition time to and from drowsy mode is 0.28 ns with a $64 \times L_{eff}$ width PMOS pass-transistor in the normal mode voltage supplier.

TABLE 1

| LEAKAGE REDUCTION TECHNIQUES | ADVANTAGES | DISADVANTAGES | LEAKAGE POWER IN LOW-LEAKAGE MODE |
|---|---|---|---|
| DVS | Retains cell info in low-leakage mode. Fast switching between power modes. Easy implementation. Allows implementation line-by-line in cache. More power reduction than ABB-MTCMOS. | Process variation dependent. More single event upset (SEU) noise susceptible. | 6.24 nW |
| ABB-MTCMOS (known) | Retains cell info in low-leakage mode. | Higher leakage power. Slower switching between power modes. Difficult to implement other than on cell by cell basis. | 13.20 nW |
| Gated-$V_{DD}$ | Largest power reduction. Fast switching between power modes. Easy implementation. | Loses cell info in low-leakage mode. | 0.02 nW |

TABLE 2

| Dynamic energy per access | Leakage energy per bit | Drowsy leakage energy per bit | Transition energy (W = $64L_{eff}$) | Drowsy transition latency |
|---|---|---|---|---|
| 2.94E−10 J | 1.63E−15 J | 2.59E−16 J | 2.56E−11 J | 1 cycle |

Embodiments of the invention implement drowsy memory cells (and cache lines) by employing a simple and effective technique of allowing for switching between two different memory cell supply voltages. This differs from the known ABB-MTCMOS drowsy cache technique which involves increasing the threshold voltages $V_t$ of NMOS and PMOS transistors of the memory cell flip-flop. The other known technique for reducing static power consumption, gated-$V_{DD}$, switches off memory cells rather than switching them to low power mode and the performance penalty for wrongly switching off a cache line is considerable.

The key difference between drowsy caches and caches that use gated-$V_{DD}$ is that in drowsy caches the cost of being wrong, that is putting a line into drowsy mode that will be accessed soon thereafter, is relatively small (it requires little energy and only one or two clock cycles, depending on circuit parameters). The only penalty is an additional delay and energy cost for having to wake up a drowsy line. Accordingly, one embodiment of the invention employs a simple cache line management technique that periodically resets all cache lines to drowsy mode, regardless of memory access patterns. A reset cache line will be reinstated to the active state via wake-up transistor 220 only when it is accessed again. This periodic reset technique is simple to implement since it requires only a single global counter and there is no need to monitor per-line cache accesses.

FIG. 7 is a table details cache line access characteristics for a number of benchmark software applications. The results of the table were obtained from an embodiment of the invention employing DVS memory circuits in an L1 32K data cache which is 4-way associative (see description of FIG. 8 below) and has a 32 byte line. In this embodiment all cache lines were reset to drowsy mode every 2000 clock cycles (2000 cycle update window). Observations of cache activity were made over this same period. The first column of the table lists 10 benchmark applications: crafty, vortex, bzip etc. The second column of the table lists the "working set", which is the fraction of unique cache lines accessed during a single update window. He third, fourth and fifth columns give the total number of cache accesses, cache accesses per line and cache accesses per cycle respectively.

The results in the table of FIG. 7 show that on most of the benchmarks the working set is relatively small. In fact for most benchmarks more than 90% of the lines can realistically be in drowsy mode at any one time. This has the potential to significantly reduce the static power consumption of the cache. The downside of the approach of a periodic global reset to drowsy mode is that the cache line wake-up cost has to be amortised over a relatively small number of accesses per line: between 7 and 21, depending on the benchmark.

The expected worst-case execution time increase for the baseline algorithm an be calculated from the following equation:

$$Execfactor = \frac{accs(wakelatency \times memimpact/accsperline) + (wsize - accs)}{wsize}$$

where accs specifies the number of accesses, wakelatency is the wakeup latency, accsperline the number of accesses per line, and wsize specifies the window size and memimpact is a variable used to describe how much impact a single memory access has on overall performance. If we make the assumption that any increase in cache access latency translates directly into increased execution time, it follows that memimpact=1. Using the above equation together with the variable values listed in FIG. 7 and assuming a 1 cycle wake-up latency, we get a maximum of 9% performance degradation for the crafty benchmark and under 4% for equake. The calculation can be further refined by ascertaining a more accurate value for memimpact. The value of memimpact is a function of both the system microarchitecture and the workload. In particular, the workload determines the ratio of the number of memory accesses to instructions. The micro-architecture determines what fraction of wake-up transitions can be hidden, that is, not translated into global performance degradation. The micro-architecture also has a significant bearing on inter-process communication (IPC) which in turn determines the number of memory accesses per cycle. Assuming that half of the wake-up transition latencies can be hidden by the micro-architecture, and based on a ratio of 0.63 memory accesses per cycle (from FIG. 7), the prediction for worst-case performance impact for the crafty benchmark reduces to 2.8%. Similarly, using the figure of 0.76 memory accesses per cycle and the same fraction of hidden wake-up transitions, we get a performance impact of about 1.4%. The actual impact of the periodic global reset technique is likely to be significantly lower than the results from the analytical model, but nonetheless, these results demonstrate that there is no need to employ cache line access prediction techniques to effectively control the drowsy cache. Provided that the cache memory circuit can transition between drowsy (unreadable) and awake (readable) modes relatively quickly, as it can in the DVS memory circuit, simple algorithms should suffice.

The right-hand side of the table of FIG. 7 contains information about how quickly the working set of the workloads is changing. The results in the rightmost three columns of the table specify what fraction of memory references in an update cycle window are to references lines that had been accessed 1, 8, or 32 windows previously. This information can be used to gauge the applicability of control policies that predict the working set of applications based on past accesses. As can be seen, on many benchmarks (e.g. bzip, gcc), a significant fraction of lines are not accessed again in a successive drowsy window. This implies that past accesses are not always a good indication of future use. Apart from the equake and mesa benchmarks, where past accesses do correlate well with future accesses, most benchmarks only re-access from 40% to 60% of the lines between update windows.

Now consider using a predictive algorithm were to keep track of which cache lines are accessed in an update window. If the predictive algorithm puts only those cache lines that have not been accessed in a predetermined number of past windows into drowsy mode, the number of awake-to-drowsy transitions per window would potentially be reduced by about 50%. This decrease in the number of cache lines set to drowsy mode also decreases the number of later wakeups, which in turn reduces the impact on execution time. However, there is a negative impact on energy savings since a larger fraction of lines are kept in full power mode, and many of those lines will not be accessed for the next several windows, if at all.

Figure 8:
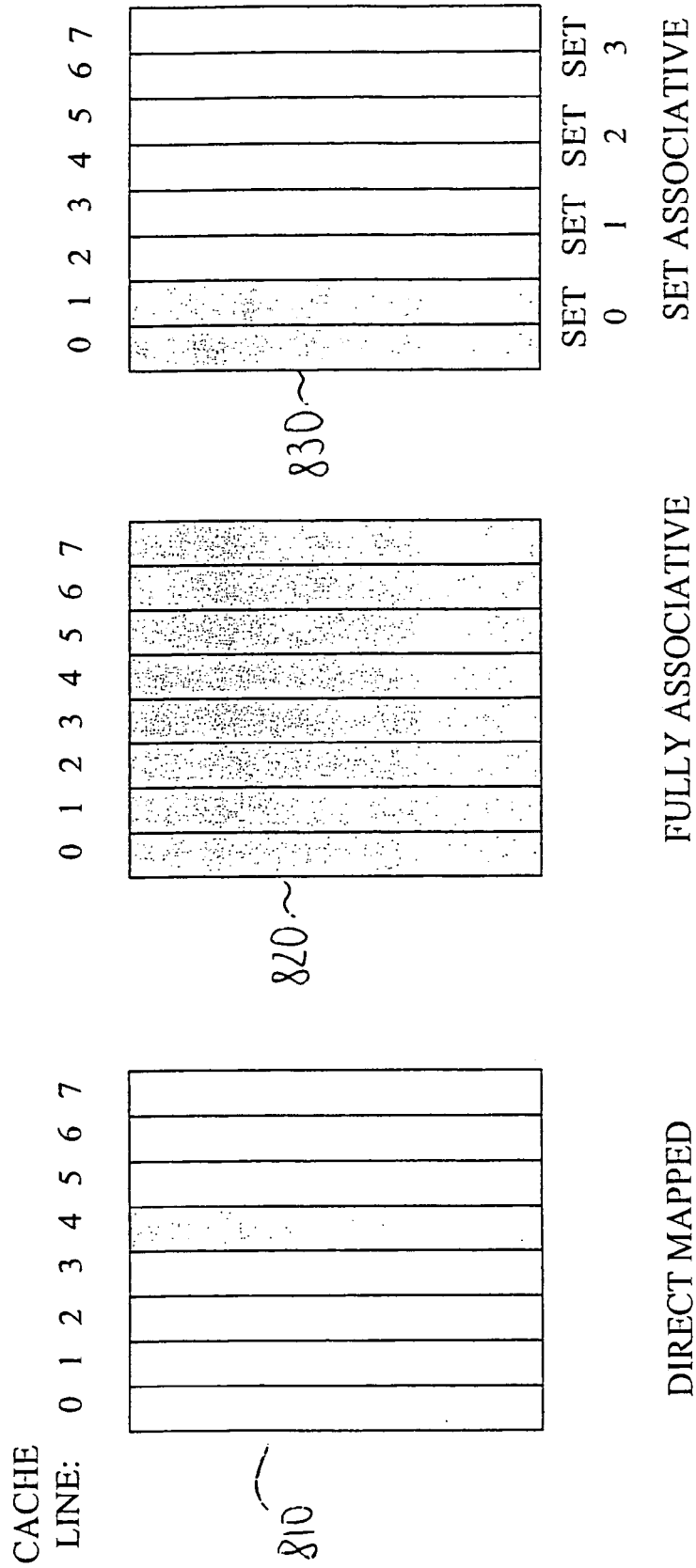
FIG. 8 schematically illustrates three alternative categories of cache organisation.

FIG. 8 schematically illustrates three alternative categories of cache organisation. Consider that the cache is initially empty in each case and we wish to store lower level memory block number 12 in cache. In this example the cache has eight cache lines although real caches would comprise hundreds of cache lines operable to selectively store data from lower level memory comprising millions of blocks. The first arrangement 810 is a direct mapped cache in which each memory location is mapped to a single cache line (in this case the memory location in question is mapped to cache line 4) and only one of the many addresses that share this cache line can use it at any one time. The mapping is usually given by (block address) MOD (number of blocks in cache). Since 12 MOD 8 is 4, memory block 12 is stored in cache line 4 in first arrangement 810. The direct mapped cache is the simplest to implement since the circuitry to check for cache hits is fast and easy to design. However, due to the inflexibility of the mapping, the hit ratio is the lowest of the three arrangements. L2 (off-chip) caches are typically direct mapped.

The second arrangement 820 is a fully associative cache, in which any memory location (such as lower level memory block 12) can be cached in any cache line. This arrangement offers the best theoretical cache hit ratio since there are so many options for caching a memory address. However, complex search algorithms are required to check for a cache hit and this can result in the whole cache being slowed down by the search.

The third arrangement 830 is a set associative cache that offers a compromise between the direct mapped 810 and the fully associative 820 arrangements. In this arrangement the cache is divided into sets of N cache lines each for an N-way associative cache. A memory block is first mapped onto a set and then the block can be placed anywhere within that set. The set is usually chosen by bit selection, that is, (block address) MOD (number of sets in cache). Accordingly 12 MOD 4 is zero so memory block 12 is stored in set 0 in arrangement 830 of FIG. 8. If N is kept small, this arrangement improves hit ratios over the direct mapped cache, but without incurring a severe search penalty. L1 caches typically use 2-way or 4-way set associative caches.

Figure 9:
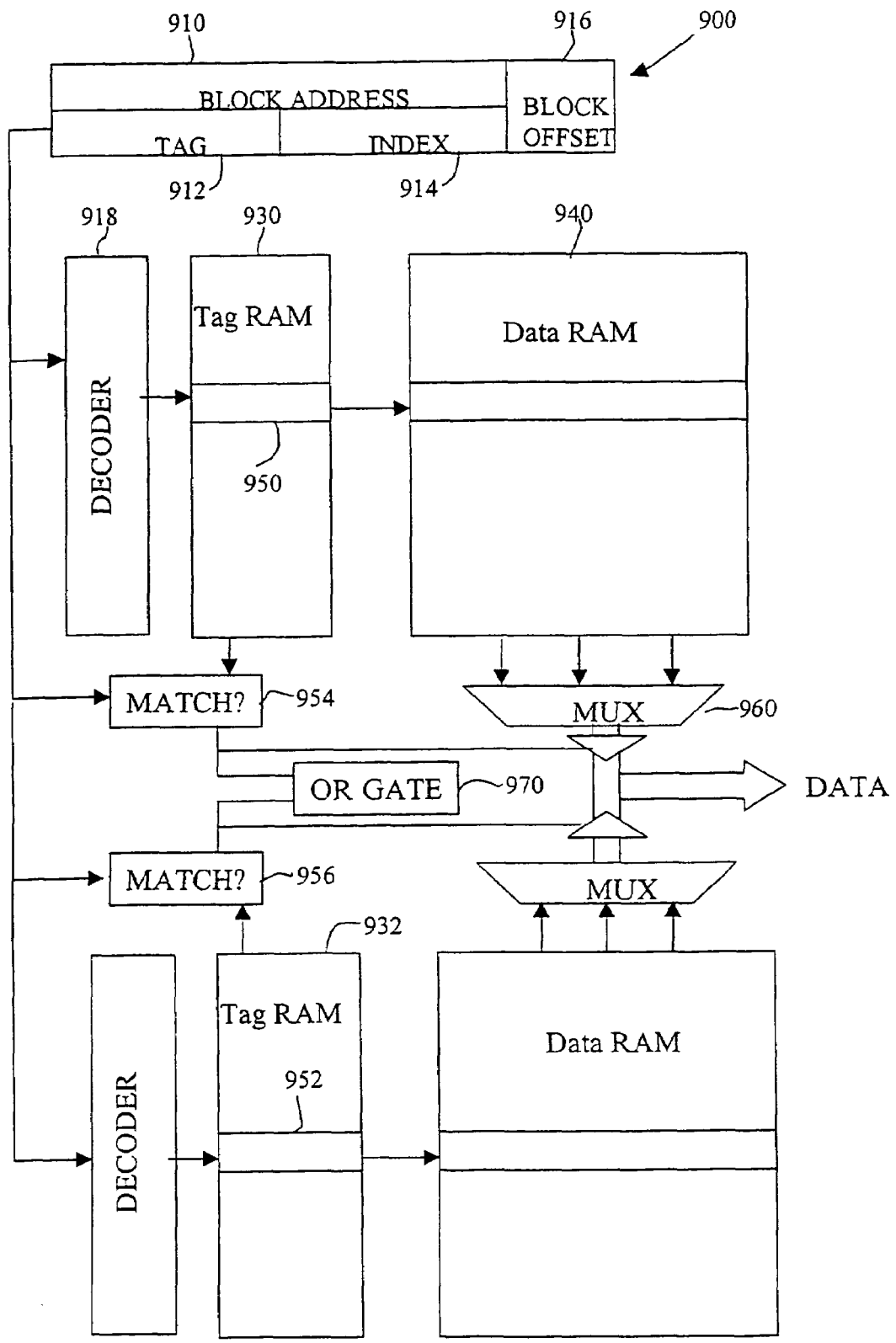
FIG. 9 schematically illustrates how a CPU address is looked up in a set associative cache memory.

FIG. 9 schematically illustrates how a CPU address is looked up in cache memory. In this case the cache memory is 2-way set associative and as such can be considered as two direct-mapped caches operating in parallel. For this cache each CPU memory address may be stored in either of two locations in cache. A CPU address 900 is divided into a block address field 910 and a block offset field 916. The block address 910 is sub-divided into a tag field 912 and an index field 914. The block offset field 916 is used to select the data from the block, the index field 914 is used to select the cache set and the tag field 912 is compared against the selected cache set for a hit. The size of the index depends on cache size, cache-line size and the degree of set associativity (which is 2 in this case). It is unnecessary to check the block offset in the comparison since the entire block (i.e. cache line) is either present or not and hence all block offsets must match.

Each of the two cache memory sets comprises a decoder 918 for decoding the CPU address 900, a data RAM 940 and a tag RAM 950 for storing a data index value indicative of data currently stored in a corresponding portion of the data RAM 940. Each cache line has an associated cache tag. A cache hit occurs when the CPU requests information from the cache and receives that information. A cache miss occurs when the CPU requests information from the cache but does not obtain it directly from that cache level.

Now consider how a cache hit occurs in the arrangement of FIG. 9. The CPU address 900 of the requested data is received and the index field 914 of the CPU address selects the tag to be tested. The tag 950 is read from the tag RAM 930 of the first data set and compared 954 with the tag portion 912 of the CPU address. Similarly the tag 952 is read from tag RAM 932 of the first the second set and compared 956 with the tag portion 912 of the CPU address. It is established by an OR gate 970 whether or not the CPU block address tag 912, matches either the cache tag 950 or the cache tag 952. If a match is found then the CPU is signalled to load the requested data from the appropriate cache line. Data is supplied to the CPU from the data RAM 940 via a multiplexer 960.

For embodiments of the invention described above, only the cache lines themselves are settable to the unreadable (or drowsy) mode whereas the cache tags 950 are always "awake" and therefore readable. However, alternative embodiments of the invention put the cache line tags into unreadable mode along with the cache line data. Reducing the supply voltage to the cache tags in addition to the cache line data has the potential benefit of further reducing static power consumption. This advantage could be partially offset by any additional latency introduced as a result of using drowsy tags. However it has been established that effect of the drowsy wake-up penalty on the processor's performance is likely to be small. Evidence for this will be presented below.

Table 3 below shows the latencies associated with accessing lines in a drowsy cache in comparison to accessing lines in a standard cache where all cache lines are awake. Table 3 relates to embodiments in which only the cache lines and not the tags can be put in drowsy mode. From Table 3, it can be seen that for a cache hit a standard cache takes a single cycle to access the data whereas for a drowsy cache line it takes two cycles to access the data. For a cache miss, there is no penalty for having a drowsy cache line in comparison to a standard cache line since the line wake-up overlaps with the memory latency associated with retrieving the data from lower level memory.

Table 4 below relates to an embodiment of the invention that implements drowsy (unreadable) tags along with drowsy (unreadable) cache lines. In this case the cache is set-associative i.e. at least two cache lines are associated with the CPU address index field 914. Accordingly, during the tag matching process, some lines of the relevant set are likely to be awake whilst others are likely to be drowsy. If all cache lines of the set are awake then the latencies are identical to those of the standard cache as listed in Table 3, the only difference being that following a cache miss and resulting cache line replacement, unneeded lines may be set back to drowsy mode. In the case where not all cache lines in the relevant set are awake, a cache hit may take up to 3 clock cycles which is an additional two-cycle latency in comparison to a standard cache hit.

Figure 10:
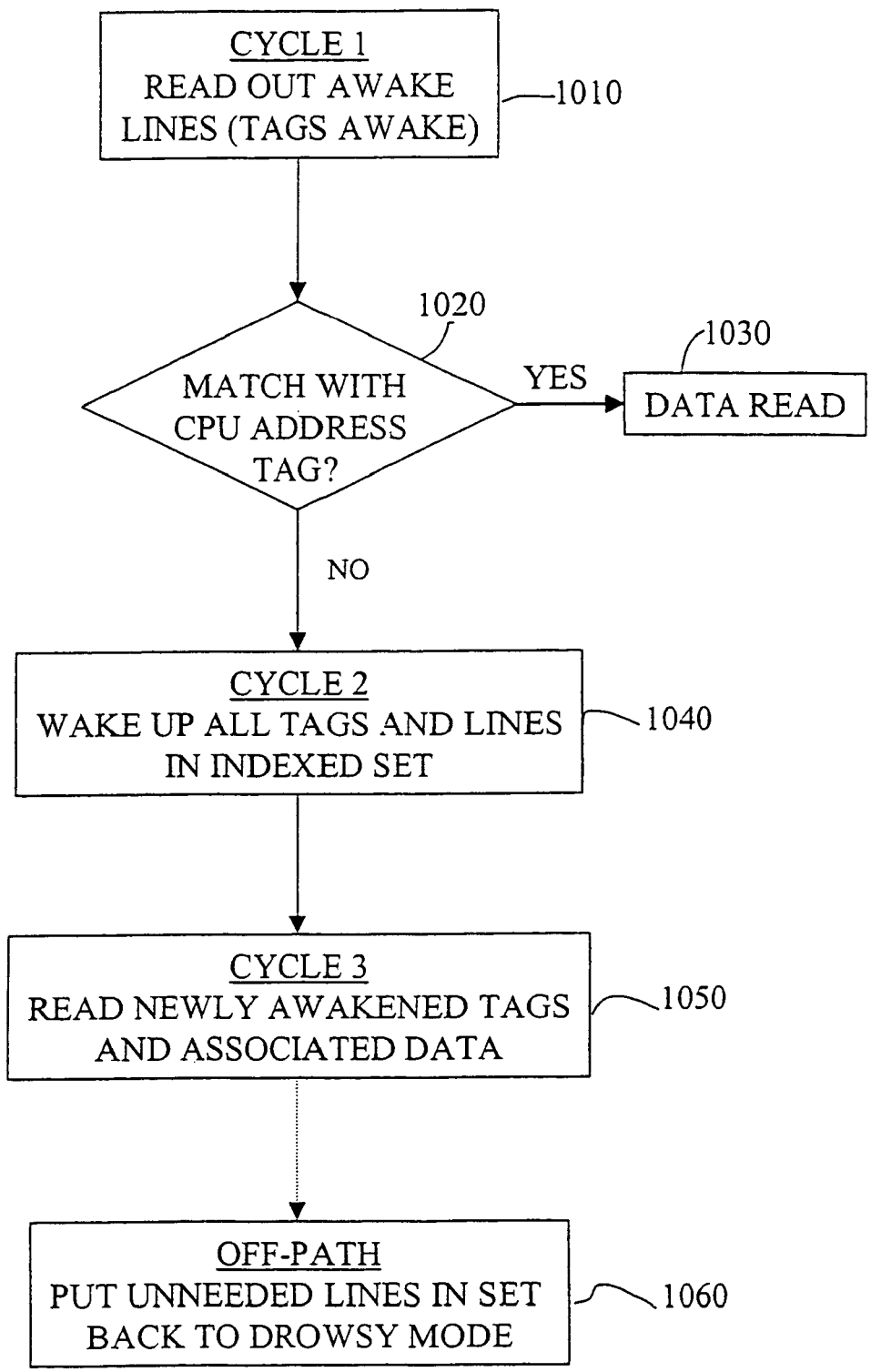
FIG. 10 schematically illustrates cache access flow control for the case where not all cache lines in the relevant set are awake and where both drowsy lines and drowsy tags are used.

FIG. 10 schematically illustrates cache access flow control for the case where not all cache lines in the relevant set are awake and where both drowsy lines and drowsy tags are used. This flow chart corresponds to the upper right hand entry in Table 4. At stage 1010, during a first access cycle, awake cache lines are read out and their awake tags are compared. At stage 1010, the controller determines whether any of the awake tags match the CPU address tag. If a match is found then the read cache line data is passed on to the CPU at stage 1030. If no match is found at stage 1020 after the first read cycle then the process proceeds to stage 1040 on the second clock cycle whereupon the cache controller wakes up all of the drowsy tags and associated cache lines in the indexed set. An additional cycle later, at stage 1050, the controller is able to read and compare the tags and to read the cache line data. Accordingly an access to a drowsy cache line having a drowsy tag takes at least three clock cycles to complete. Since, according to this scheme drowsy cache lines are woken up at stage 1040 just so that their tags can be compared, they are reset from readable to drowsy mode soon after. If these cache lines were likely to be accessed soon then they would likely have been awake initially. The reset to drowsy mode occurs off-path at stage 1060.

Referring once more to Table 4, the lower right-hand entry of the table corresponds to a cache miss in a situation where not all cache lines of the set are awake. In this case there is an additional (maximum) two-cycle latency (prior to performing the line replacement) in comparison to a cache miss in which all lines and tags in the set are awake. These two additional cycles correspond to a cycle during which awake tags are checked for a match and, in the event that no match is found for awake tags, an additional cycle to wake up drowsy lines in the set. Similarly to the process for the cache miss detailed in FIG. 10, following the cache line replacement unneeded lines in the set are put back into drowsy mode.

Note that in the case of direct-mapped caches there is no performance advantage (in comparison to implementing drowsy cache lines without drowsy tags) in keeping the tags awake since there is only one possible line for each index, thus if the cache-line is drowsy, it must be woken up immediately to be accessed.

There are a number of different possible cache control policies that can be used determine which cache lines (or lines and tags) are set to drowsy mode during process execution. In order to assess the impact on performance of different control policies a number of test simulations were performed using alternative control policies. A first policy, denoted the "simple policy" involves periodically resetting all lines in cache to drowsy mode. Here, the period corresponds to the window size. Furthermore, in this case no per-line access history is used in determining which cache lines to set to drowsy mode. A second policy, denoted the "noaccess policy" sets to drowsy mode only those lines that have not been accessed within a given update window. All of the algorithms corresponding to the tested control policies involved periodically evaluating the cache contents and selectively putting lines into drowsy mode.

TABLE 3

|  | AWAKE CACHE LINES AWAKE TAGS | DROWSY CACHE LINE AWAKE TAGS |
|---|---|---|
| CACHE HIT | 1 cycle to access line | 1 cycle - establish tag match and wake up drowsy line; 1 cycle - read/write line. |
| CACHE MISS | 1 cycle - establish no tag match and find line to replace; +memory latency to retrieve requested data from lower level memory | 1 cycle - establish no tag match and find line to replace; +memory latency to retrieve requested data from lower level memory - wake up line during memory latency period |

The simulations were performed using a SimpleScalar systems design testbed (with SPEC2000 benchmark programs) and an Alpha instruction set. The cache parameters for the simulation were: 32K direct-mapped L1 instruction cache, 32 byte line size —1 cycle hit latency, 32K 4-way set associative L1 data cache, 32 byte line size —1 cycle hit latency, 8 cycle L2 cache latency. Two different pipeline configurations were used: an "OO4" configuration in which a 4-wide superscalar pipeline was used; and an "IO2" configuration in which a 2-wide in-order pipeline was used. All simulations were run for 1 billion instructions. The OO4 configuration has an "out-of-order core", which is a processor that allows simultaneous or out-of order execution of multiple reads and writes to the same register. The IO2 configuration on the other hand has an "in-order core". In some cases, results for a simpler "in-order core" have also been established.

Figure 11A:
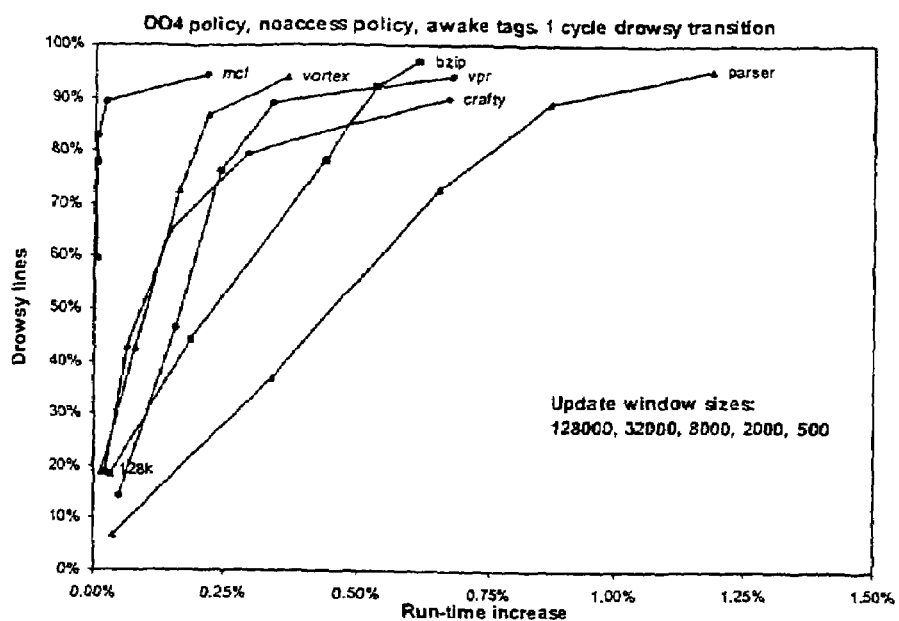
FIG. 11A shows results of a simulation for the OO4 policy (out-of-order core)
Figure 11B:
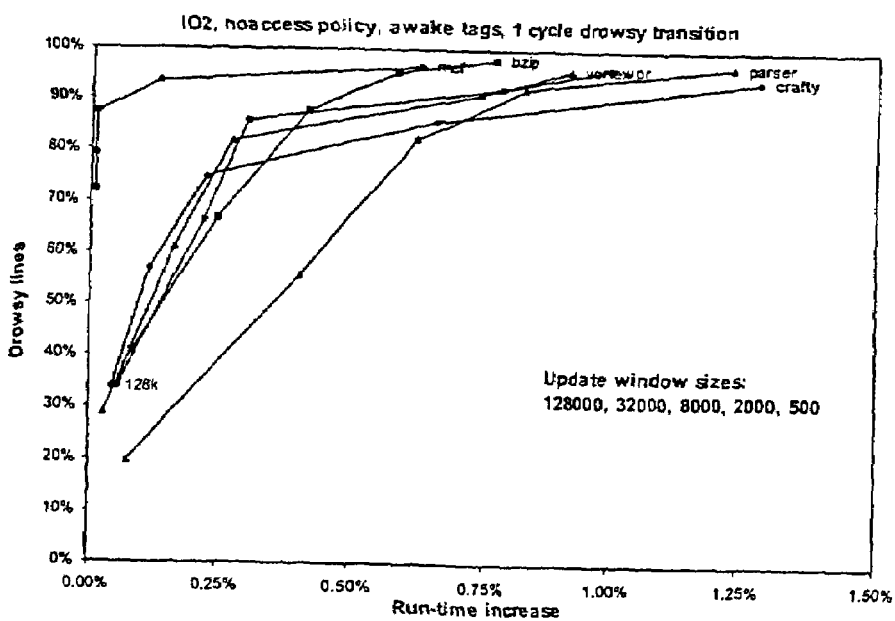
FIG. 11B shows results of a simulation for the IO2 policy (in-order core)

FIGS. 11A and 11B show how window size (in cycles) impacts both performance and the fraction of drowsy lines for six benchmarks: mcf, vortex, bzip, vpr, crafty and parser. The simulations were performed using the noaccess policy, using drowsy lines, awake tags and a 1-cycle drowsy transition. The graphs plot the percentage of drowsy cache lines against the percentage run-time increase for update window sizes of 500, 2000, 8000, 32000 and 128000 cycles. The smaller the window size, the higher the percentage of drowsy lines and the greater the run time increase so that the right-most data points on each line correspond to the smallest window size. FIG. 11A shows results of a simulation for the OO4 policy (out-of-order core) whilst FIG. 11B shows results of a simulation for the IO2 policy (in-order core). Apart from the data for small window sizes, the graphs of FIG. 11A and FIG. 11B look very similar. For the out-of-order core (see FIG. 11A), the point where the energy-delay product is minimised, which is known as the "sweetspot", is at an update window of around 2000 cycles. Whereas for the in-order core (see FIG. 11B), the sweetspot moves to a window size of between 4000 and 8000 cycles. The reason is that because the interprocess communications (IPCs) of the benchmarks using the IO2 model (out-of-order core) tend to be a little less than half of the IPCs in the OO4 model (in-order core), fewer memory accesses are made within the same number of clock cycles for the IO2 model than for the OO4 model. The run-time overhead of the drowsy cache and its effectiveness are correlated with the number of cache line accesses within an update window. Since the IO2 (in-order core) model has around half of the cache line accesses per update window as the OO4 (out-of-order core) model it follows that comparable power-performance trade-off points are found at about twice the window size on the IO2 model as on the OO4 model.

The reason for the relatively small impact of the drowsy wake-up penalty on the in-order processor performance (IO2 policy) is due to the use of a non-blocking memory system, which can handle a number of outstanding loads and stores while simultaneously continuing execution of independent instructions. Moreover, the drowsy wake-up penalty is usually only incurred with load instructions, since stores are put into a write buffer, which—if not full—allows execution to continue without having to wait for the completion of the store instruction.

TABLE 4

|  | ALL CACHE LINES IN SET AWAKE THEREFORE ALL ASSOCIATED TAGS AWAKE | SOME CACHE LINES IN SET DROWSY - TAGS OF DROWSY LINES ARE ALSO DROWSY - SOME CACHE LINES IN SET ARE AWAKE |
|---|---|---|
| CACHE HIT | 1 cycle to access line | 1 cycle - check awake tags for possible hit - if no hit established then; 1 cycle - wake up drowsy lines (having drowsy tags) in set; 1 cycle - read/write line |
| CACHE MISS | 1 cycle - establish no tag match and find line to replace; +memory latency to retrieve requested data from lower level memory; Off path: put any unneeded lines in set into drowsy mode | 1 cycle - check awake tags for possible hit - if no hit established then; 1 cycle - wake up drowsy lines (having drowsy tags) in set; 1 cycle - establish no tag match for newly awakened tags so find line to replace; +memory latency to retrieve requested data from lower level memory - wake up line during memory latency period; Off path: put any unneeded lines in set back into drowsy mode |

Figure 12A:
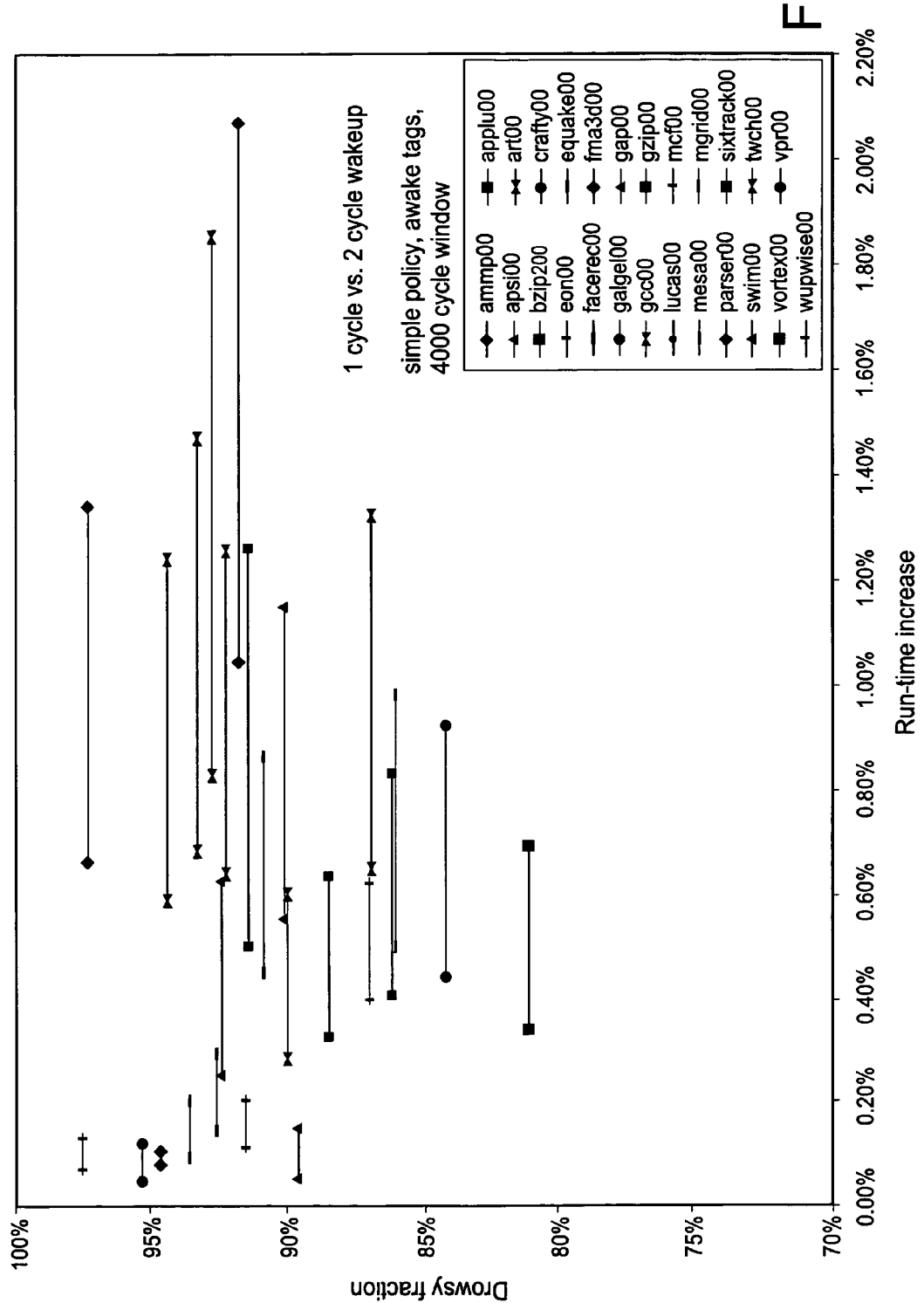
FIG. 12A shows simulation results for the simple mode control policy (i.e. periodic global refresh) for both a one-cycle line wake-up and a 2-cycle line wake-up.
Figure 12B:
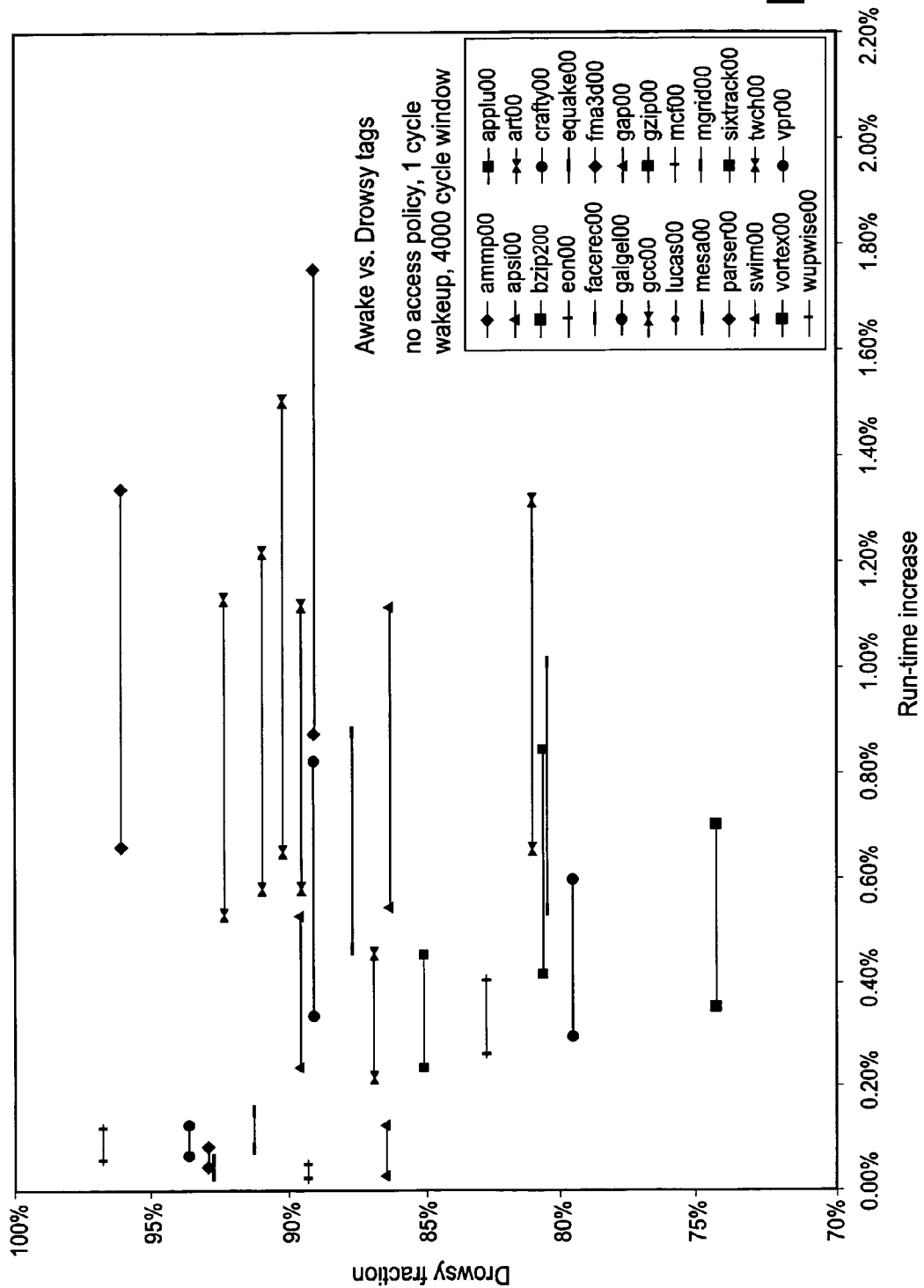
FIG. 12B shows simulation results for a "noaccess" mode control policy for a fixed 1-cycle wakeup providing a comparison of a policy with both drowsy tags and drowsy lines and a policy with drowsy lines and awake tags.

FIGS. 12A and 12B show the performance impact of increased drowsy access latencies for a fixed update window size. In both cases the fraction of drowsy lines is plotted against the run-time increase. FIG. 12A shows results for the simple policy (i.e. periodic global refresh) for both a one-cycle line wake-up and a 2-cycle line wake-up. FIG. 12B shows results for the noaccess policy for a fixed 1-cycle wakeup and affords a comparison of a policy with both drowsy tags and drowsy lines and a policy with drowsy lines and awake tags. In both graphs, the two end points of a line represent the two different configurations of each benchmark. In FIG. 12A the left-most point of each line corresponds to a 1-cycle wake-up whereas the right-most point of each line corresponds to a 2-cycle wake-up. In FIG. 12B the left-most point of each line corresponds to awake tags whereas the right-most point of each line corresponds to drowsy tags. Each of the different types of overhead (i.e. increasing the wake-up cycle time and changing from awake tags to drowsy tags) has a similar impact on the given policy. In particular the fraction of drowsy lines is unchanged, while the impact on run-time increases. This is apparent from inspection of the graphs in FIGS. 12A and 12B where it can be seen that the lines connecting the two points are horizontal and the points corresponding to the two-cycle wakeup or the drowsy tags are always on the right. The run-time impact on the simple policy of FIG. 12A is larger compared to the noaccess policy of FIG. 12B, since a larger fraction of the cache is drowsy at any one time when the simple policy is used. Also note that for a given policy, the run-time overhead of using drowsy tags should be very similar to increasing the transition latency to two cycles. This is because both the simple model and the noaccess model increase the most common type of drowsy access, which is the drowsy hit, by the same amount.

Figure 13:
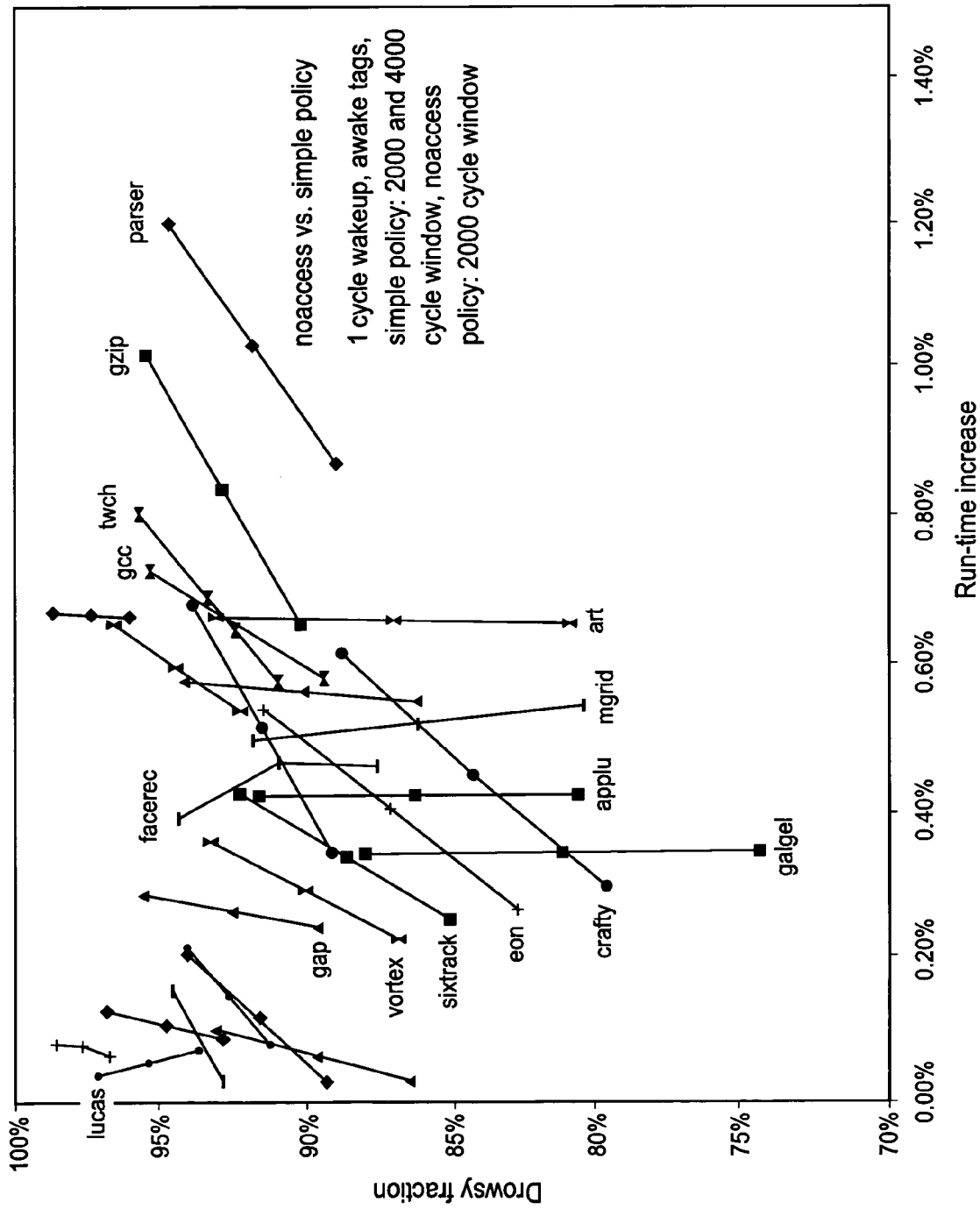
FIG. 13 is a graph of the fraction of drowsy lines against the percentage run-time increase that provides a comparison between the noaccess policy and the simple policy.

FIG. 13 is a graph of the fraction of drowsy lines against the percentage run-time increase that provides a comparison between the noaccess policy and the simple policy. In this case, a 1-cycle wakeup and awake tags are used for the simulations. The objective of these simulations was to ascertain whether a policy that involves keeping track of per-line access statistics is significantly better than a periodic global reset to drowsy mode. Three different configurations fare shown for each benchmark on the graph: the noaccess policy with a 2000 cycle window and two configurations of the simple policy (4000 cycle and 2000 cycle windows). In all cases, the policy configurations follow each other from bottom data point to top data point in the graph in the aforementioned order. Accordingly, it can be seen that in all cases the noaccess policy has the smallest fraction of drowsy lines. This is to be expected, since it is the noaccess policy is more conservative than the simple policy about which lines are put into drowsy mode. The performance impact is never more than 1.2% for any configuration and the fraction of drowsy lines is never under 74%.

The benchmark applications on the graph can be partitioned into two groups: benchmarks associated with lines on the graph which are close to vertical (e.g. applu, art and mgrid); and benchmarks associated with lines on the graph that are more horizontal having and thus have a smaller positive slope (e.g. gzip, parser and crafty). All of the benchmarks that are close to the vertical are floating point benchmarks and their orientation implies that there is very little or no performance benefit to using the noaccess policy or larger window sizes. In fact, the mgrid, galgel, applu, facerec, and lucas benchmarks have a slight negative slope, implying that not only would the simple policy win on power savings over the noaccess policy, it would also win on performance. However, in all cases the performance difference is negligible and the potential power improvement is under 5%. The reason for this behaviour is the very bad reuse characteristics of data accesses in these benchmarks. Thus keeping lines awake (i.e. noaccess policy, or larger window sizes) is unnecessary and even counterproductive.

This anomalous behaviour in the floating-point benchmarks is not replicated on the integer benchmarks. For the integer benchmarks the noaccess policy wins on performance (i.e. gives the smallest run-time increase) in all cases but saves the least amount of power since the fraction of lines in drowsy mode at any one time is larger than for the simple policy. However, this does not imply that if performance degradation is a key issue then the more sophisticated noaccess policy should always be selected. The slope between the upper two points on each line on the graph of FIG. 13 is almost always the same as the slope between the bottom two points, which suggests that the rates of change between the data points of a given benchmark are the same. From this observation it can be deduced that a given data point for the noaccess policy should be able to be matched by a different configuration of the simple policy. This deduction has been verified by simulations which have shown that the data point for an 8000 cycle update window of the simple policy comes very close to the data point co-ordinates for the noaccess policy with a 2000 cycle window.

We found that for a given machine configuration, a single static window size (2000 to 8000 cycles, depending on configuration) performs adequately on all of our benchmarks. However, the optimum window size varies slightly for each workload. Accordingly, alternative embodiments of the invention use an adaptive window size rather than a static window size. Use of an adaptive window size has the advantage that it allows for a finer power-performance trade-off. One such adaptive window-size embodiment involves monitoring the microarchitecture and counting the number of stall cycles that can be attributed to the drowsy wakeup latency. The cache lines of this embodiment are returned to drowsy mode again only when their previous wakeup overheads have been amortized (i.e. when the performance impact falls under a given threshold). The user can set the threshold value according to a desired compromise between reduced performance and increased power savings.

The dynamic voltage scaling (DVS) circuit according to embodiments of the invention does not offer the lowest leakage power per bit when compared with the known methods. However, the fact that each memory cell maintains its stored value when in unreadable mode, allows for an aggressive algorithm when deciding which cache lines to put into drowsy mode. It has been shown that using such an aggressive algorithm together with the DVS technique, the total energy consumed in the cache is reduced by an average of 54%. This compares well with the theoretical maximum reduction of 65% corresponding to a hypothetical circuit that consumes no leakage energy in drowsy mode. Given that the proportion of the total leakage energy consumed in drowsy mode is only 24% (on average), further reductions of leakage energy to that achievable via the simple or noaccess memory-cell state control policies will yield only diminished returns. Moreover, as the fraction of leakage energy is reduced from an average of 76% in projected conventional caches to an average of 50% in the drowsy cache, dynamic energy rather than leakage energy once again becomes a prime candidate for reduction.

During the investigations of drowsy caches it was found that the "simple" policy (where cachelines are periodically put into a low-power mode without regard to their access histories) significantly reduces the cache's static power consumption whilst having only a small adverse performance impact. The simple global refresh policy is not a solution to all caches in the processor. In particular, the L1 instruction cache does not do as well in terms of leakage power reduction as the L1 data cache with the simple algorithm and the noaccess policy gives only slightly better results. Accordingly, for such instruction caches the DVS drowsy circuit technique is used alongside instruction prefetch algorithms in order to reduce leakage power.

From the simulation results presented in FIG. 13, it has been established that a simple policy with a window size of 4000 cycles affords a reasonable compromise between simplicity of implementation, power savings, and performance. The impact of this policy (4000 cycle periodic global refresh) on leakage energy will now be evaluated.

FIG. 14 is a table of data that allows a comparison of the energy savings made by implementing the simple policy with a window size of 4000 cycles, with and without the use of drowsy tags for each of a number of benchmark applications. In this case a 1-cycle drowsy transition and an OO4 policy (out-of-order core) were used. The table lists the normalised total energy, the normalised leakage energy and the run-time increase for each benchmark. Separate data sets are provided for awake tags and for drowsy tags. The normalised total energy is the ratio of total energy used in the drowsy cache divided by the total energy consumed in a regular cache. Similarly, normalised leakage energy is the ratio of leakage energy in the drowsy cache to leakage energy in a normal cache. The data in the DVS columns correspond to the energy savings resulting from the scaled-VDD (DVS) circuit technique according to embodiments of the invention while the theoretical minimum column assumes that leakage in low-power mode can be reduced to zero (without losing the memory state). The theoretical minimum column estimates the energy savings given the best hypothetical circuit technique. For all the results in the table, it is conservatively assumed that there are only 19 tag bits (corresponding to 32 bit addressing) per line, which translates into 6.9% of the bits on a cache line.

The table in FIG. 14 shows that for this embodiment of the invention the total energy consumed in the data cache can be reduced by more than 50% without significantly impacting performance. The total leakage energy is reduced by an average of 71% when tags are always awake and by an average of 76% using the drowsy tag scheme. It seems that leakage energy could potentially be cut in half if the efficiency of the drowsy circuit techniques are improved (see the theoretical minimum column of the table). However, the benefits of any further reduction of leakage in drowsy mode are tempered by the fact that lines must still spend time in full-power mode when being accessed, and consequently their leakage power consumption is at least an order of magnitude higher. Thus, the impact of more efficient drowsy circuits on total energy savings is reduced. Nonetheless, if the circuits were made more efficient without significantly increasing the transition time, the simple policy could take advantage of that.

An important question is whether it is worth using the drowsy tag scheme rather than simply using drowsy lines where the associated tags are awake. The energy-delay product of the benchmarks when using drowsy tags is always lower than with awake tags, so the decision about whether to use drowsy tags or not comes down to acceptable engineering trade-offs. Direct-mapped caches, tags can be put into drowsy mode without undue performance impact or implementation complexity. However, using a direct mapped data cache instead of the typical 4-way set associative cache one has its own costs: miss rates on the benchmarks are approximately tripled, which aside from the performance penalty, can significantly impact the total energy consumption of the processor.

The circuits of FIG. 2 and FIG. 4 although applicable to caches in general are particularly suitable for use in data caches. Instruction caches have different locality characteristics from data caches so it is appropriate to adapt the circuits and algorithms accordingly. We shall now consider a circuit technique and micro-architectural control technique that is particularly suitable for making drowsy instruction caches as opposed to data caches.

Figure 15A:
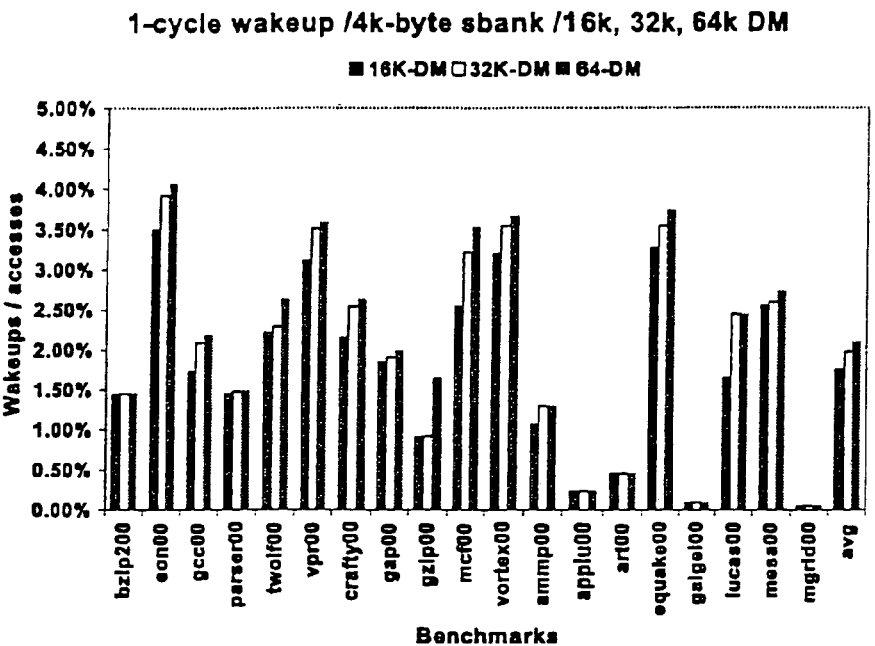
FIGS. 15A and 15B show results of simulations in which the effects of a known technique were assessed.
Figure 15B:
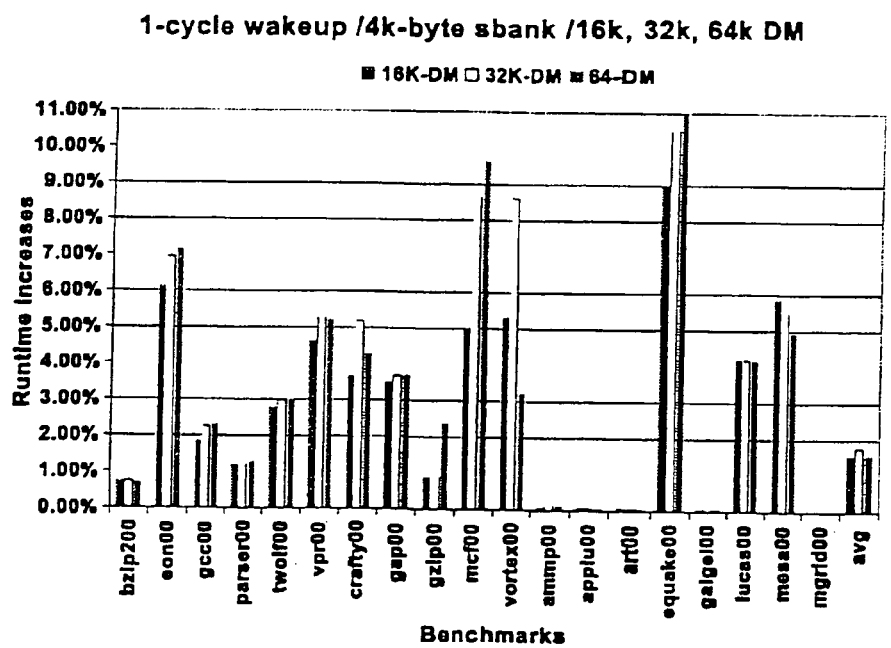

It is known to use subbanks as a means of reducing power consumption in caches. For example "Reducing power in superscalar processor caches using subbanking, multiple line buffers and bit-line segmentation" by K. Ghose and M. Kamble and published in Proceedings of the International Symposium on Low Power Electronics and Design, 1999 (pp. 70 -75) describes a system in which the instruction cache is partitioned into several sub-banks, and on each cache access only a limited set of sub-banks are checked for their contents. This approach reduces the dynamic power consumption of the cache although the cache access time is slightly increased due to additional decoder logic that is required for indexing the subbanks. Furthermore, the paper "Dynamic Fine-Grain Leakage Reduction using Leakage-Biased Bitlines" by S. Heo, et al. and published in the Proceedings of the International Symposium on Computer Architecture, 2002 described a sub-banked cache memory arrangement in which a leakage power reduction circuit technique was applied to the most recently accessed sub-bank. The circuit technique described therein acts to reduce the leakage power consumption of the cache memory circuit by biasing the bit-lines in dependence upon the number of ones and zeros connected to each bit-line. A significant disadvantage of this known technique is that the processor must wake up the next target subbank on the critical path and the penalty for this wake-up can be several clock cycles. It has been established that this wake-up penalty results in a run-time increase of 4.06% to 12.46% on SPEC 2000 benchmarks, even when assuming an aggressive singe cycle wake-up penalty. FIGS. 15A and 15B show results of simulations in which this known technique was applied to a data processing system and its effect was assessed during running of a number of benchmark application programs.

According to the present technique a cache memory circuit similar to that of FIG. 4 is used in a system employing cache sub-banking and in which various special sub-bank prediction techniques are employed. The present technique has less of a performance impact than the known sub-banking techniques, yet still reduces leakage power consumption. According to the present technique the sub-bank prediction methods rely on the insight that transitions between sub-banks are often correlated with specific types of instructions. Due to program loops, the program counter, which is the instruction cache access index, remains in certain small sub-regions of cache for relatively long periods of time. However, there are often abrupt changes in the accessed cache region when sub-routines are called, or when a subroutine returns, and also when certain unconditional branches are executed. Most conditional branches stay within the current cache region and it is rare that these branches jump across cache page boundaries. It will be recognised that the sub-branching prediction techniques according to the present technique may be used with low leakage circuits other than the drowsy circuit that will be described.

Figure 16A:
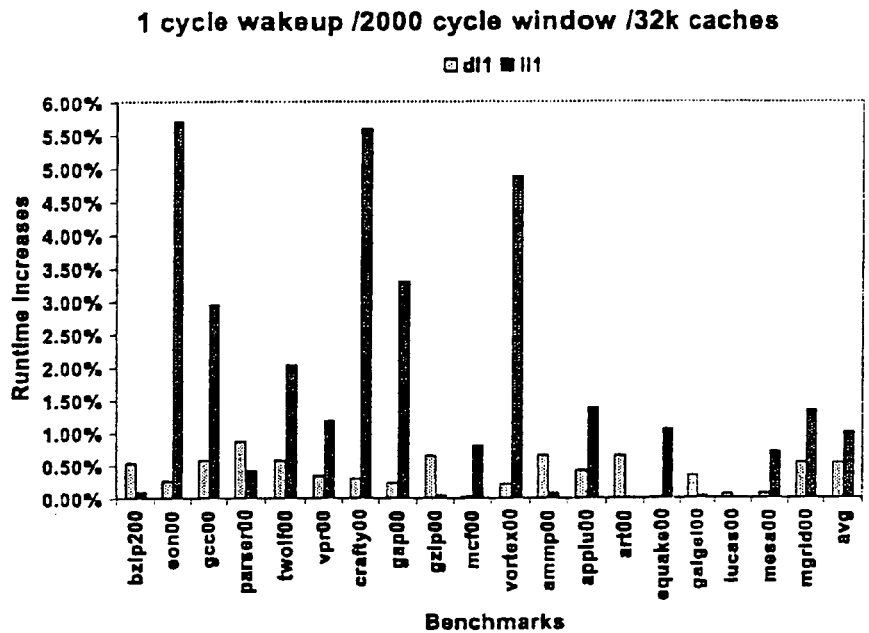
FIGS. 16A and 16B are histograms showing results of a simulation in which a comparison is made of the effectiveness of the simple policy on data caches and on instruction caches.
Figure 16B:
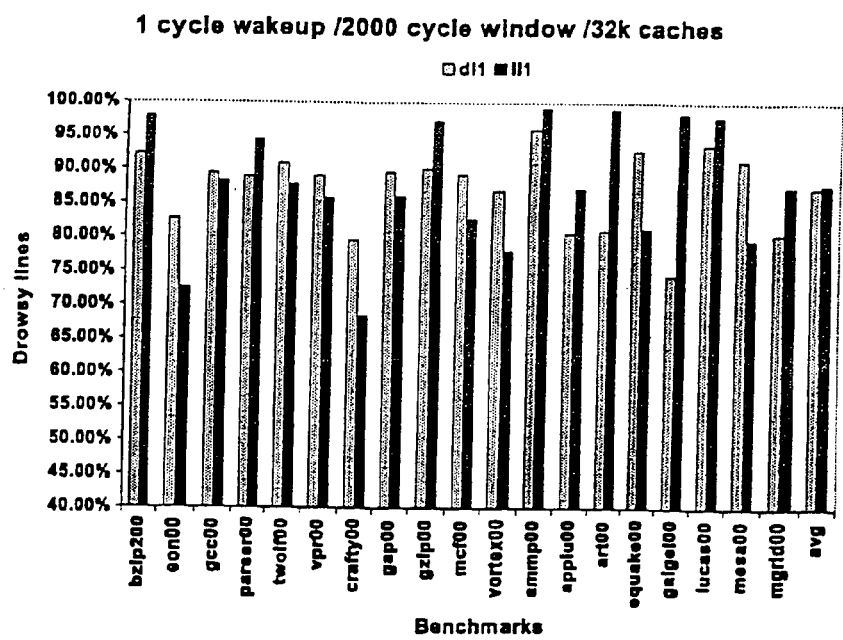

FIG. 12A (described above) shows the performance impact of increased drowsy access latencies for the simple cache line management technique (i.e. periodic global refresh) for a data cache. FIGS. 16A and 16B are histograms showing results of a simulation in which a comparison is made of the effectiveness of the simple policy on data caches and on instruction caches. The simulations were performed on each of a 32 K-byte direct mapped instruction cache and a 32 K-byte four-way set associative data cache. FIG. 16A shows the run-time increases due to implementation of drowsy cache lines with the simple policy for a number of benchmark application workloads. FIG. 16B shows the percentage of drowsy lines for the same simulation. The percentage of drowsy lines is proportional to the leakage power reduction achieved. A 2000-cycle update window was used for the simulations, which meant that all cache lines were put into drowsy mode every 2000 clock cycles. On the histograms of FIGS. 16A and 16B the bars labelled dl1 correspond to results for the data cache whereas the bars labelled Il1 correspond to results for the instruction cache.

FIG. 16A shows that using the simple policy on the 32K byte direct-mapped instruction cache may have a run-time impact of as much 5.7%, and FIG. 16B shows that the percentage of drowsy cache lines can be as low as 68.5%. The lower the percentage of drowsy cache lines the smaller the achieved reduction in leakage power consumption. The results for the instruction cache are is in sharp contrast with the simulation results for the data cache, where on the same benchmarks the run-time impact is no more than 0.87% and the fraction of drowsy lines is no lower than 74.4%. These experimental results show that the application of the drowsy technique for the instruction cache can result in both poor performance and relatively low leakage reduction compared to the results achievable on the data cache. This behaviour can be explained by considering that data caches are known to have better temporal locality whereas instruction caches tend to have better spatial locality.

Figure 17:
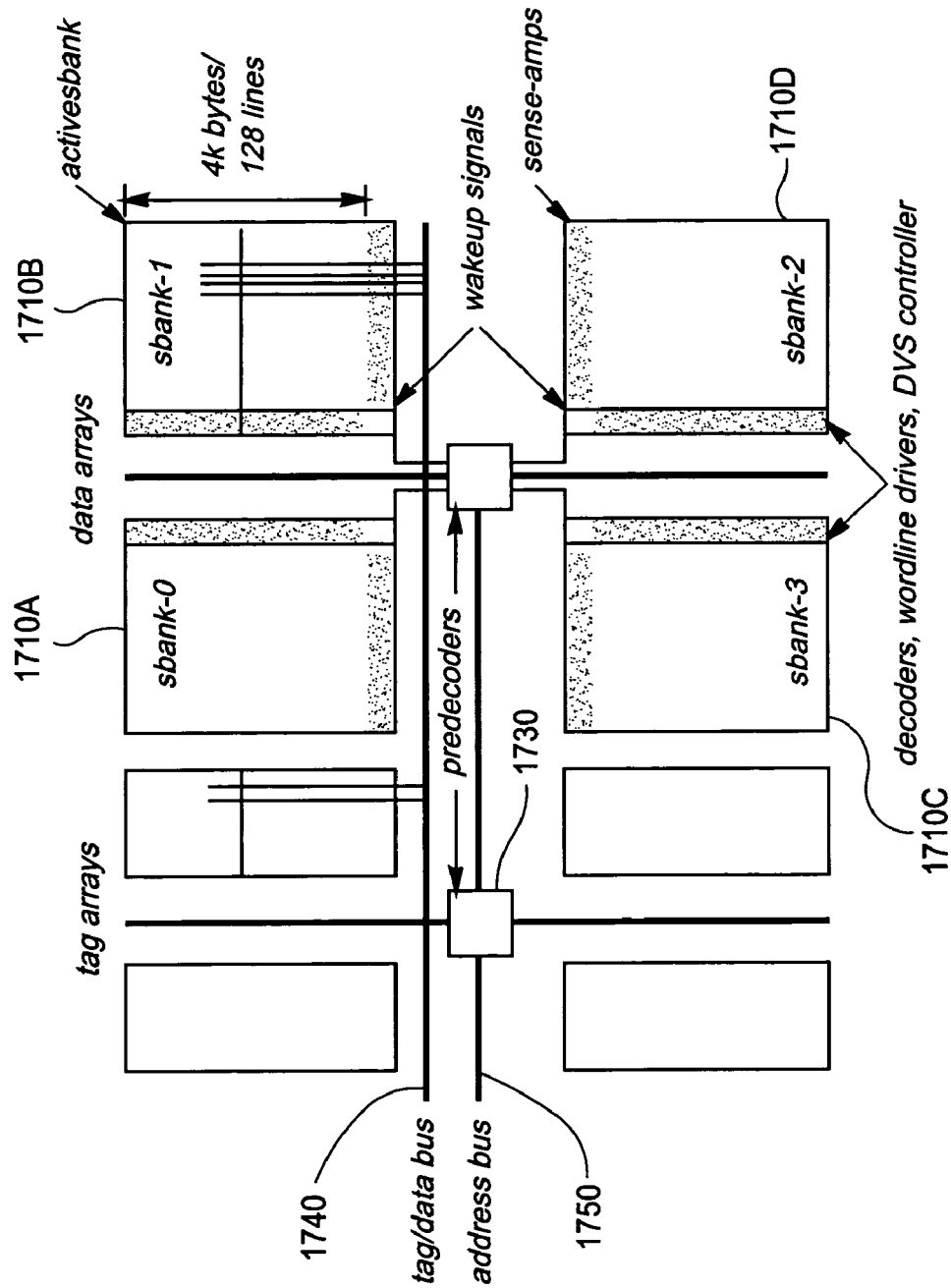
FIG. 17 schematically illustrates a cache architecture that uses memory sub-banking and voltage scaling techniques.

FIG. 17 schematically illustrates a cache architecture that uses memory sub-banking and voltage scaling techniques. The cache comprises four 4K-bytes sub-banks 1710A to 1710D giving a total 16K byte capacity, four corresponding tag arrays 1720A to 1720D, two predecoders 1730A and 1730B, a tag/data bus 1740 and an address bus 1750. The cache is direct-mapped. The pre-decoders 1730A and 1730B are operable to identify which of the four cache sub-banks should be accessed for a given cache access address. Each sub-bank comprises a decoder, wordline drivers and a dynamic voltage scaling controller (none of which are shown in FIG. 17). The decoder in each sub-bank uses the pre-decoded address to select an appropriate cache line in the sub-bank. The predecoder includes wake-up logic that drives a wake-up signal to a drowsy target sub-bank. Only one subbank is active (i.e. awake) at any one time, while the remaining sub-banks are held in a drowsy mode by scaling the voltage levels of all cache lines in the sub-bank. Whenever the processor attempts to access a particular cache line in a non-active sub-bank, the predecoder 1730B activates the next target sub-bank (i.e. the sub-bank to which that particular cache line belongs), and puts the currently active sub-bank back into drowsy mode. During the time period in which the next target sub-bank is being activated, a wake-up latency is incurred because the processor must halt until the power supply lines of the target sub-bank have been raised to the normal non-drowsy voltage level whereupon the particular cache line can be read. On a cache hit, this wake-up latency is incurred on the critical path whereas on a cache miss, the wake-up latency can be hidden during the miss handling cycles. Therefore, to avoid undue performance degradation on a cache hit, it is important to wake-up the next sub-bank as soon as possible.

Figure 18:
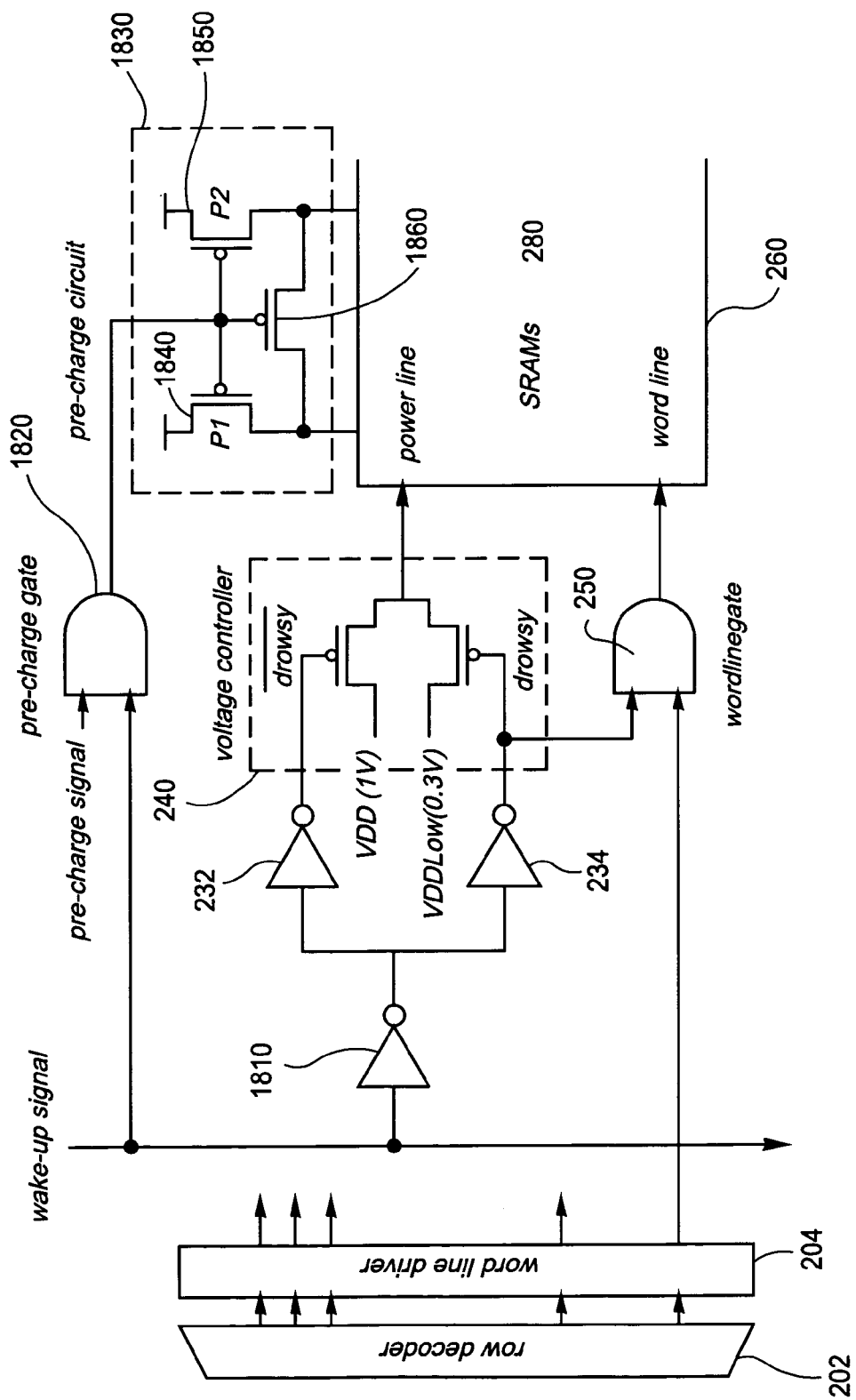
FIG. 18 schematically illustrates a drowsy cache line circuit for use in an instruction cache according to the present technique.

FIG. 18 schematically illustrates a drowsy cache line circuit for use in an instruction cache according to the present technique. The drowsy instruction cache circuit of FIG. 18 is similar in construction to the drowsy data cache circuit of FIG. 2. However the drowsy instruction circuit has a simple inverter 1810 in place of the drowsy bit control circuit 210 and includes an additional pre-charge gate 1820 and pre-charge circuit 1830 comprising three p-type transistors 1840, 1850 and 1860. A wake-up signal is supplied as input to the inverter 1810 and to the pre-charge gate 1820, which is an AND gate. A pre-charge signal is supplied as a second input to the pre-charge gate 1820. The output of the pre-charge gate is fed as input to the pre-charge circuit 1830. Rather than waking up single cache lines via the drowsy bit for each line as in the circuit of FIG. 2, the circuit of FIG. 18 relies on wake-up logic in the pre-decoder 1750B to send a wake-up signal to the entire target sub-bank.

The pre-charge circuit 1830 serves to reduce the leakage current through the wordline pass transistors in the conventional 6 transistor memory cell (as illustrated in FIG. 3) by gating the pre-charge signal with the wake-up signal. This pre-charge gating technique, eliminates the requirement for high-Vt pass transistors (such as transistors 430 and 440 in FIG. 4) to reduce the leakage power via the pass transistors. Accordingly, the access time for the sub-banks is reduced.

Figure 19:
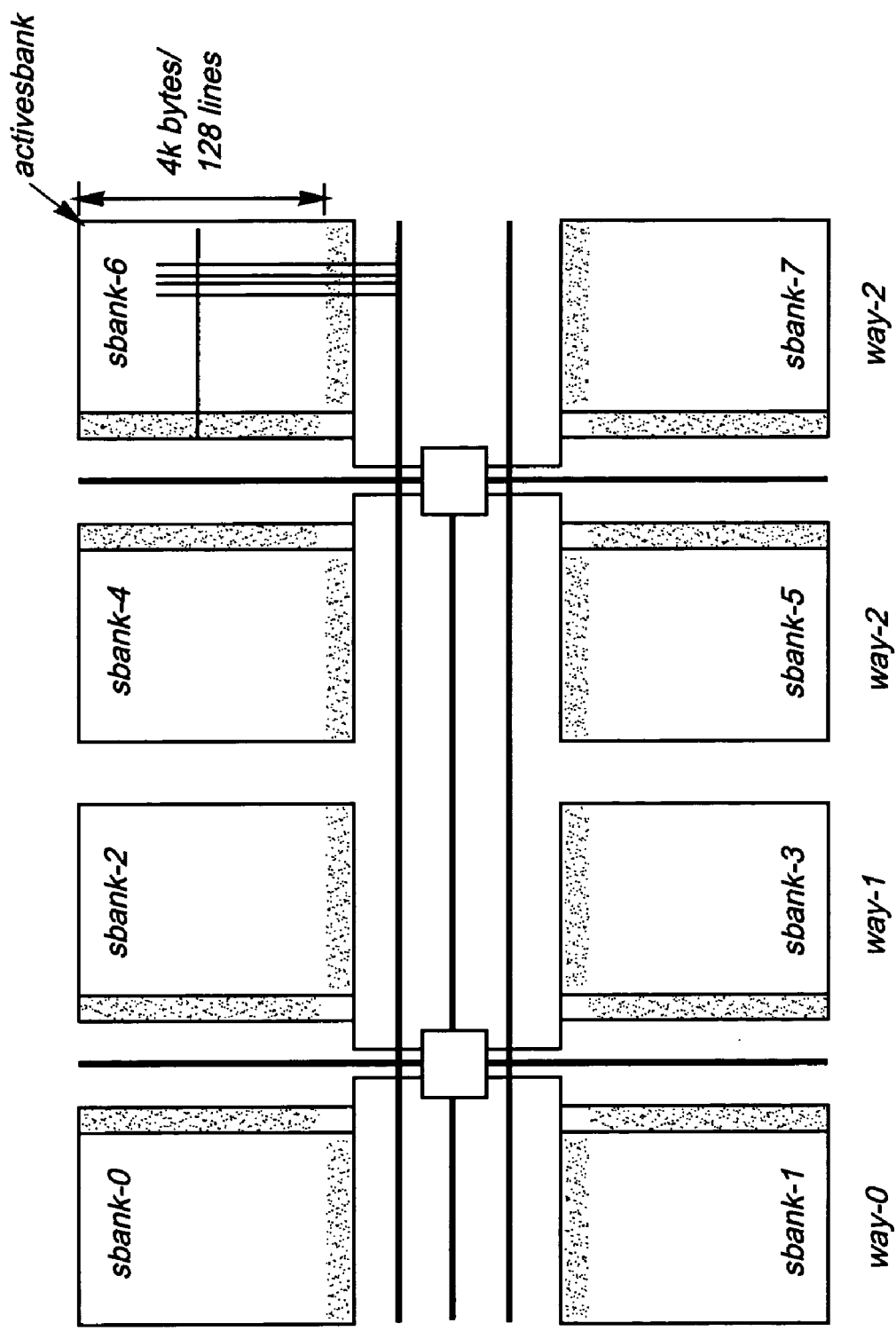
FIG. 19 schematically illustrates a vertical configuration for a sub-banked cache.

A cache can be sub-banked in two different ways: vertically or horizontally. FIG. 19 schematically illustrates a vertical configuration for a sub-banked cache. The cache illustrated in FIG. 19 is a 32 K-byte 4-way set associative cache. Two 4-Kbyte sub-banks are assigned to each of way0, way1, way2 and way3. Of the total of eight sub-banks only one sub-bank is activated at a time. From FIG. 19, it can be seen that only sub-bank6 is active in this case. The remaining seven sub-banks are in drowsy mode.

Figure 1:
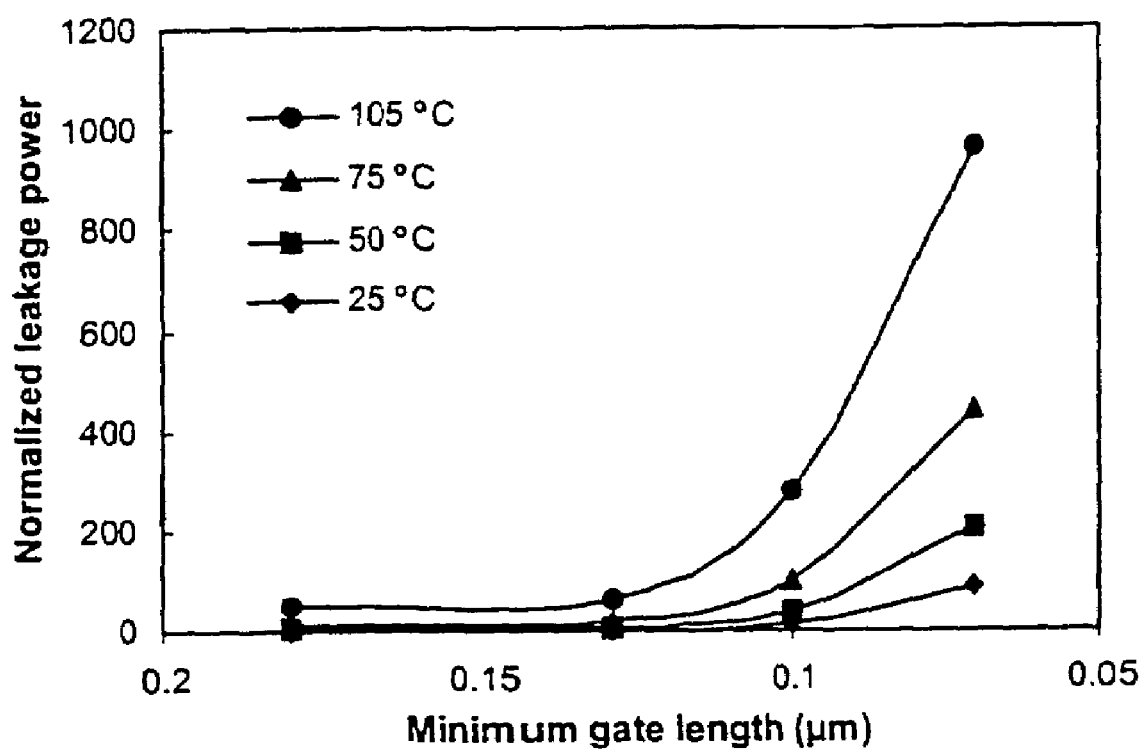
FIG. 1 schematically illustrates the known relationship between minimum gate length and normalised leakage power for a transistor.
Figure 20:
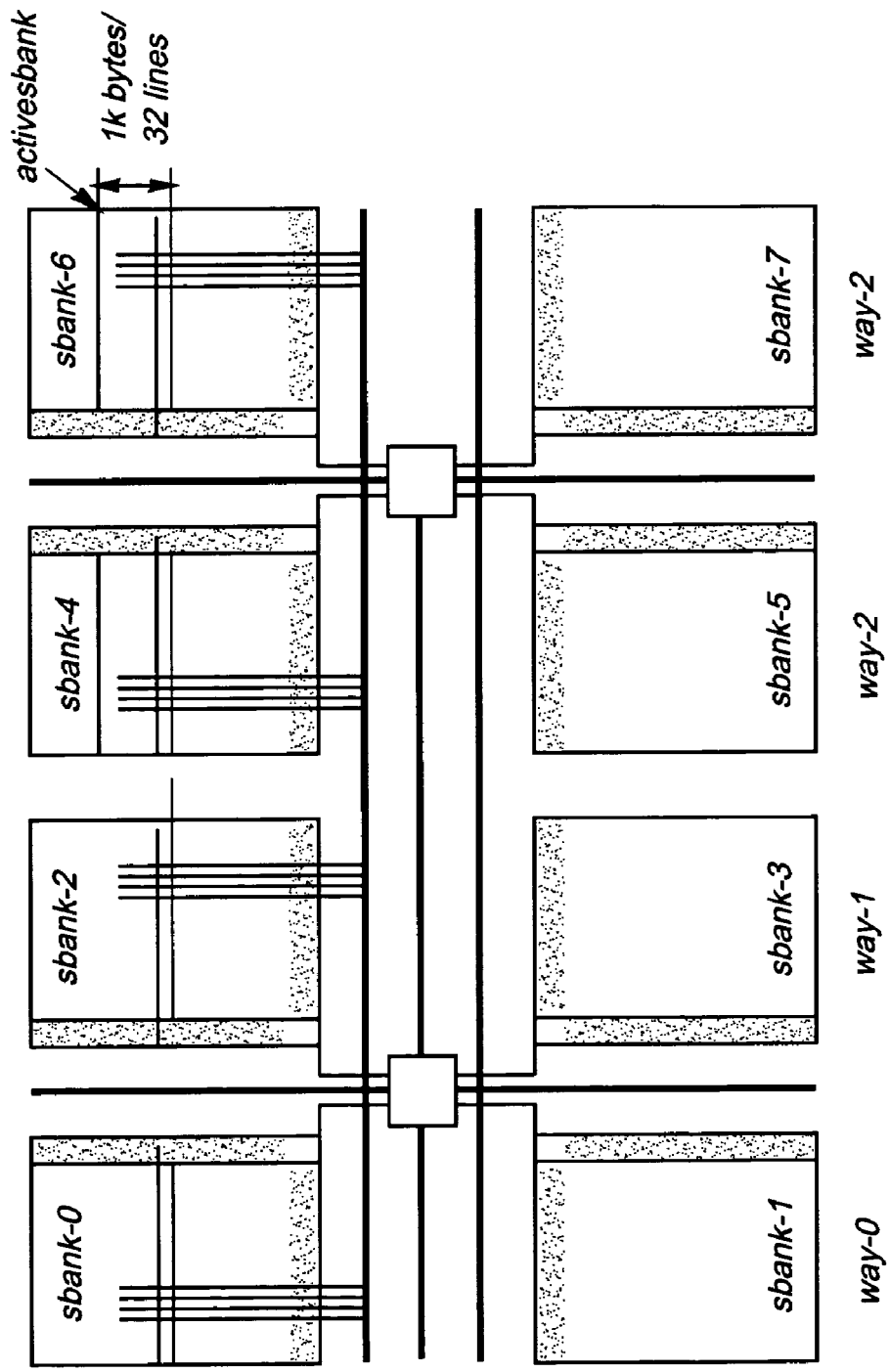
FIG. 20 schematically illustrates a horizontal configuration for a sub-banked cache.

FIG. 20 schematically illustrates a horizontal configuration for a sub-banked cache. As for FIG. 19 the cache arrangement represents a 32 Kbyte 4-way set associative cache having eight 4 Kbyte sub-banks. According to this horizontal arrangement sub-banks are distributed through the 4-ways. In particular, 1 K-byte of each of four sub-banks is assigned for a given one the 4-ways. As shown in FIG. 20 1 Kbyte from each of sub-bank0, sub-bank2, sub-bank4 and sub-bank6 in the upper row of sub-banks is currently active. This horizontal configuration requires a separate pre-charge circuit 1830 (see FIG. 18) for each 1 Kbyte portion of the 4 Kbyte sub-bank.

In the vertical configuration of FIG. 19, a change of either the sub-bank address or the way address may cause a performance loss. This is because it is likely that the processor is looking for data that is contained in a currently inactive (drowsy) way of the cache. However, the vertical configuration has the advantage of lower dynamic power consumption, since only one way of the 4-way set associative cache. The vertical configuration, being the simpler of the two was used for the purposes of the test simulations discussed below.

As illustrated in FIGS. 15A and 15B performance can be significantly degraded for instruction caches by wake-up penalties. According to the present technique it is recognised that devising a scheme to predict the next target sub-bank could reduce the wake-up penalties. It has been established that subroutine calls, returns and long distance unconditional branches cause most transitions between instruction cache sub-banks. Furthermore, transition points from one sub-bank to another tend to repeat. Accordingly, by marking in the cache the instructions that cause sub-bank transitions information is obtained that can be used to ameliorate the wake-up penalty.

Figure 21:
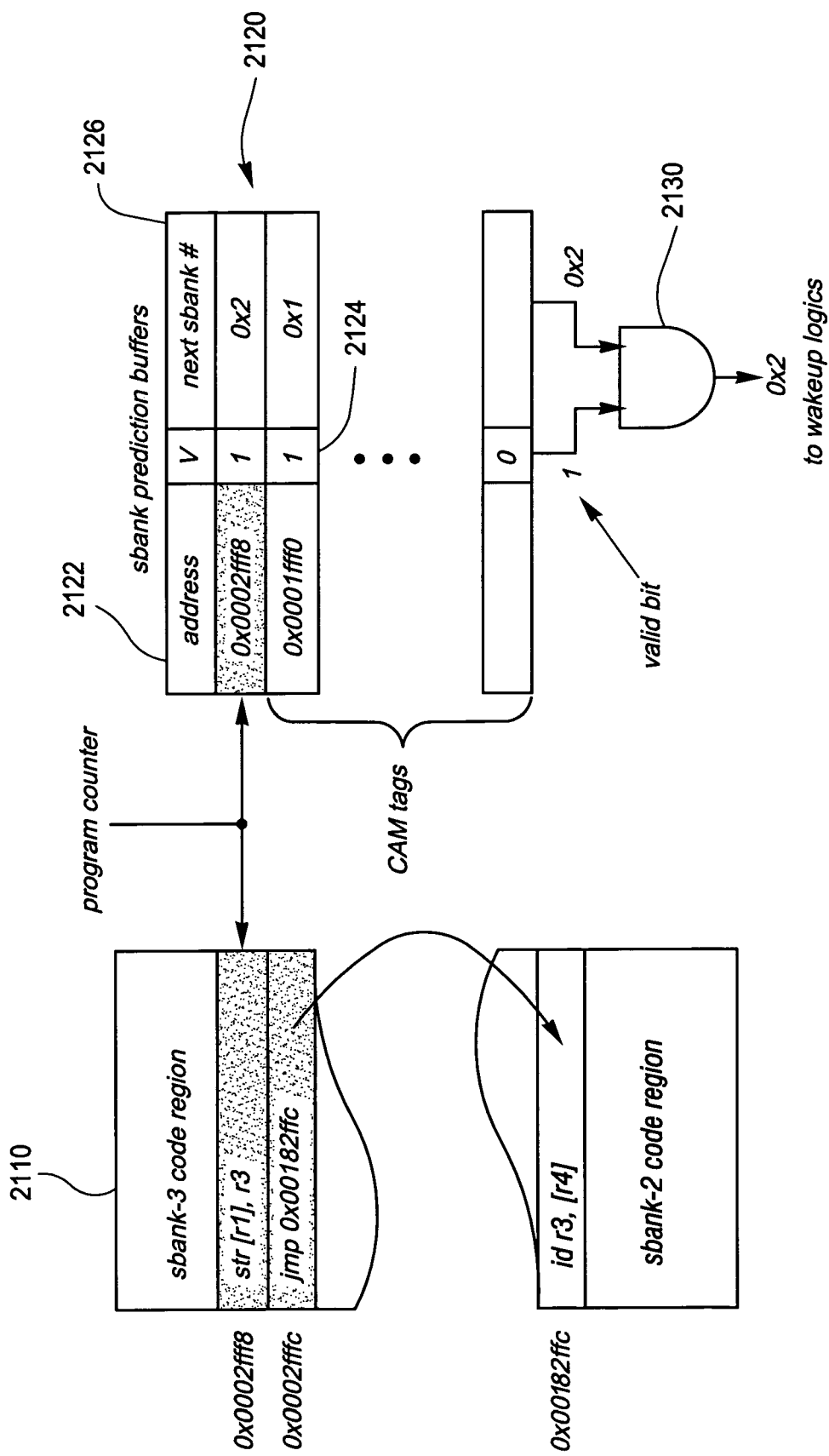
FIG. 21 schematically illustrates a next sub-bank prediction buffer arrangement for a 16 Kbyte direct mapped cache.

FIG. 21 schematically illustrates a next sub-bank prediction buffer arrangement for a 16 Kbyte direct mapped cache. The arrangement comprises a main sub-bank code region 2110, a set of sub-bank prediction buffers 2120 and a logic AND gate 2130 that is coupled to wake-up logic. The sub-bank prediction buffers 2120 comprise an address region 2122, a valid bit region 2124 and a next valid sub-bank index region 2126. A program counter that determines a current execution point is located at the first instruction of the sub-bank3 code region in the arrangement of FIG. 21. It is assumed for the purposes of the arrangement of FIG. 21 that there is a single-cycle wake-up latency and that code regions of the current sub-bank3 and the next sub-bank2 are already in the cache.

Each prediction buffer entry of the address region 2122 contains an instruction address which is the address of the instruction one before the instruction (usually a branch) which leads to another sub-bank. The buffer entry also contains the next target sub-bank index and a valid bit. On each cache access, the sub-bank prediction buffer 2120 is consulted to see whether or not a new sub-bank is predicted to be awakened. If there is a mis-prediction, or no prediction at all, the old entry is updated or a new one allocated.

In the example of FIG. 21 the control flow is predicted to jump from the sub-bank 3 code region to the sub-bank 2 code region. It is important to predict the next target sub-bank address one instruction ahead of the current execution point in order to avoid losing performance due to the one cycle wake-up overhead. For the vertical sub-bank configuration of a set associative cache (as illustrated in FIG. 19), the sub-bank index field 2126 also contains the target way information along with the sub-bank number.

The address region 2122 of the sub-bank prediction buffer 2120 contains addresses that correspond to content addressed memory (CAM) tags. A CAM cell is a RAM cell with an in-built comparator so a CAM based tag store can perform a parallel search to locate an address in any location. Both the circuit area overhead and the power overhead of the prediction buffer can be significant using the sub-bank prediction technique illustrated in FIG. 21. In particular, the CAM tag in the prediction buffers can consume significant amounts of dynamic power.

Figure 22:
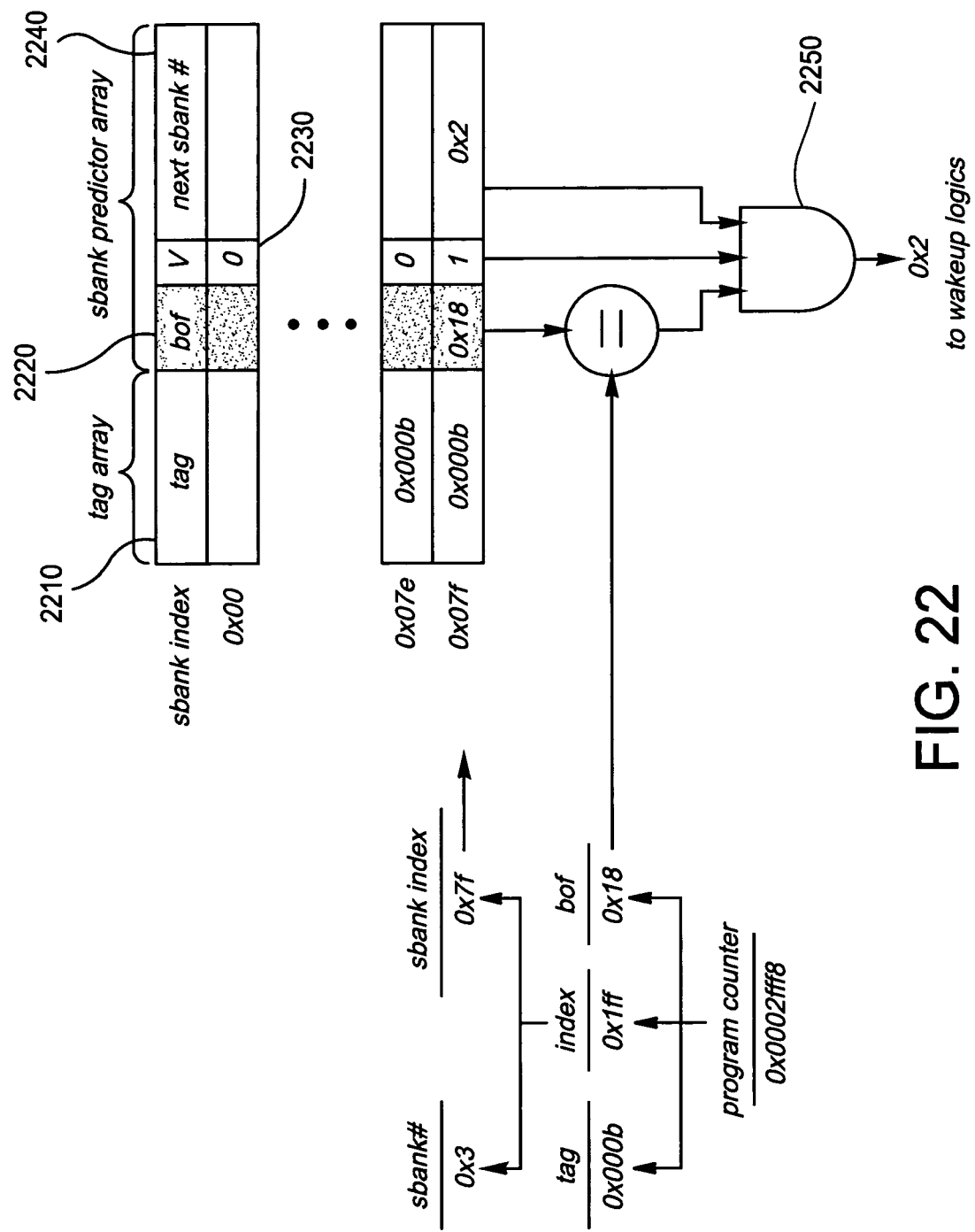
FIG. 22 schematically illustrates an arrangement in which extended cache tags are used to support the next sub-bank prediction.

FIG. 22 schematically illustrates an arrangement in which extended cache tags are used to support the next sub-bank prediction. The use of extended cache tags reduces the power cost of the next sub-bank prediction process. In this case the next sub-bank prediction buffer comprises a tag array 2210, a "bof" field 2220 which contains a block address of the transition instruction, a valid bit field 2230 and a next sub-bank number field 2240. Each tag array 2210 entry is associated with a sub-bank index. The valid bit, the next sub-bank number and the result of a comparison performed on the "bof" index for a given row of the sub-bank prediction array are supplied as three inputs to an AND logic gate 2250. Whenever the processor accesses the cache, it compares the block address of the current program instruction and checks the validity of the prediction information. If the address matches and the information is valid then the processor sends the predicted next sub-bank address to the wake-up logic via the AND gate 2250. A potential disadvantage of using the arrangement of FIG. 22 is that prediction information is lost if the cache line is replaced. Furthermore, multiple next sub-bank addresses cannot be kept in a cache tag when there are multiple transition addresses in a cache line. However, experiments have show that this situation arises relatively infrequently.

Figure 23:
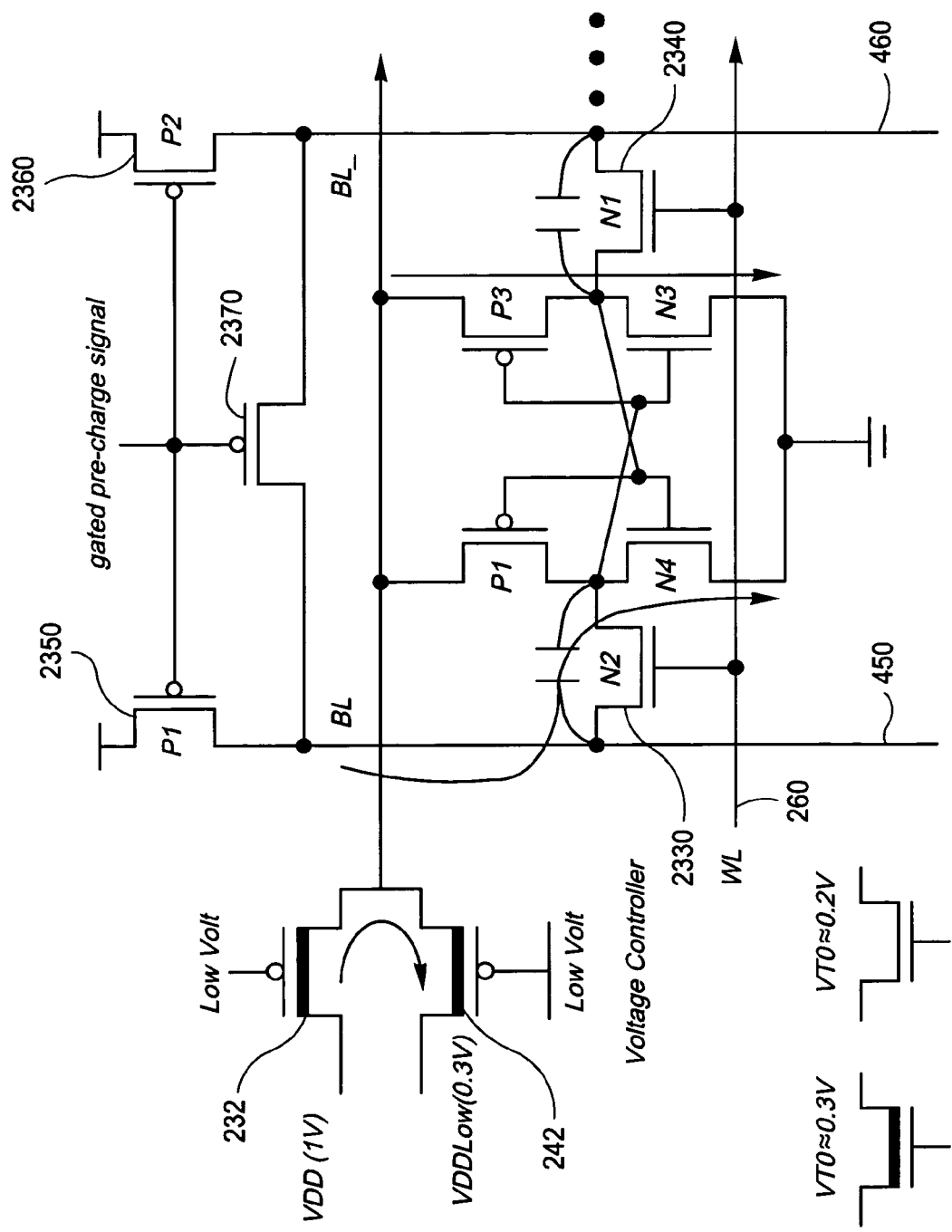
FIG. 23 schematically illustrates a dynamic voltage scaling circuit according to the present technique that is suitable for implementation in an instruction cache memory cell.

FIG. 23 schematically illustrates a dynamic voltage scaling circuit according to the present technique that is suitable for implementation in an instruction cache memory cell. The circuit of FIG. 23 is similar in construction to the DVS memory circuit of FIG. 4. The notable differences between these two DVS memory circuits are that in the circuit of FIG. 23 the pass transistors 2330 and 2340 that connect the internal inverters of the memory to the read/write lines are standard Vt (0.2V) devices rather than high Vt (0.3V) devices. Furthermore, the circuit of FIG. 23 has gated pre-charge circuitry comprising a PMOS transistor 2350, 2360 on each of the bit lines 450, 460 and a further PMOS transistor 2370 connected between the bit lines 450, 460. A gated pre-charge signal is supplied as input to each of the three PMOS transistors 2350, 2360, 2370 of the pre-charge circuit.

In the memory cell of FIG. 4 each cache line in is controlled independently and each bit line is shared by all the cache lines in a sub-bank, all the read/write lines are maintained at high-Vdd. Accordingly in the circuit of FIG. 4 it is necessary to use high-Vt transistors 430, 440 for the pass gates in order to maintain an acceptable leakage current level. However, in the case of the instruction cache memory cell of FIG. 23, the entire instruction cache sub-bank is switched between low-Vdd and high-Vdd. Since the read/write lines in each sub-bank are included in the DVS no high-Vt pass-transistors are needed in the circuit of FIG. 23.

Avoiding the use of high-Vt device for the memory cells as in the instruction cache circuit of FIG. 23 has several advantages with regard to the memory cell circuit of FIG. 4. Firstly, the access time of the cache is not compromised. High-Vt devices show poor current driving capability at the same gate input voltage, which results in slower caches. Particularly for instruction caches, which are critical in determining the cycle time of the processor, it is important to avoid any increase of the access time. For this reason a direct-mapped cache, which is faster than a set-associative cache, is usually employed for an instruction cache. A second advantage of the circuit of FIG. 23 is that the use of low-Vt pass-transistors reduces the dynamic power. In the memory circuit of FIG. 4, significantly larger pass transistors 430, 440 are used to compensate the reduced current driving capability, which is impaired by high-Vt threshold voltage.

In FIG. 23, one PMOS pass gate 232 connects the supply line to the normal supply voltage and the other PMOS transistor 242 connects the supply line to the low supply voltage for the drowsy mode. Each pass gate 232, 242 is a high-Vt device to prevent leakage current from the normal supply to the low supply through the two PMOS pass gate transistors. A separate voltage controller can be implemented for each sub-bank or for each cache line. A potential disadvantage of the circuit of FIG. 23 is that it has both increased susceptibility to noise and variation of Vt across process corners.

The noise susceptibility problem may be corrected with careful layout because the capacitive coupling of the lines is small. To examine the stability of a memory cell in the low power mode, a simulation was performed a write operation to an adjacent memory cell that shares the same bit lines but whose supply voltage was normal. The coupling capacitance and the large voltage swing across the bit lines would make the bit in the drowsy memory cell vulnerable to flipping if the circuit had a stability problem. However, simulation results have established that the state of the drowsy memory cell is in fact stable. There was only a slight fluctuation in the core node voltage caused by the signal cross-talk between the bit lines and the memory internal nodes. In addition, there is no cross-talk noise between the word line 260 and the internal node voltage, because word line gating prevents accesses to memory cells in drowsy mode. Although the voltage scaling technique has less immunity against a single event upset (SEU) from alpha particles, this problem can be ameliorated using process techniques such as silicon on insulator (SOI). Furthermore other static memory structures also suffer from this problem, making it necessary to implement error correction codes (ECC) even for non-drowsy caches. The problem of variation of Vt, may be addressed by choosing a conservative Vdd value, such as Vdd=1V, as in the circuit of FIG. 23.

As was the case for the circuit of FIG. 4, the memory cell layout in this case was done in TSMC 0.18 um technology. The dimensions of the memory cell and voltage controller were identical to those specified above in relation to the circuit of FIG. 4 and the circuit area overhead of the voltage controller is equivalent to 3.35 memory cells for a 64×Leff (effective gate length) voltage controller. For the circuit of FIG. 23 the following (conservative) area overhead factors were assumed: 1.5 equivalent memory cells for the control signal driver (three inverters); and 1.5 equivalent memory cells for the word-line gating circuit (a NAND gate). The total overhead is thus equivalent to 6.35 memory cells per cache line 9 (which compares with 7.35 memory cells per cache line for the memory circuit of FIG. 4). The total area overhead is less than 3% for the entire cache line. To examine the effects of circuit issues like stability and leakage power reduction, a linear scaling technique was applied to all the extracted capacitances.

The results of experimental simulations to determine the prediction accuracy and run-time increase of the sub-bank predictors of FIG. 21 and FIG. 22 will now be described. The simulation methodology used for the purposes of the experiments combined detailed processor simulation both for performance analysis and for gathering event counts. In addition, analytical modelling was employed for estimating the energy dissipation for both conventional caches and for caches employing drowsy techniques. As for the previously described simulations the SimpleScalar systems design testbed was used. In this case an out-of-order speculative processor with a two-level cache hierarchy was modelled. The simulation parameters, which are listed in the table of FIG. 24, roughly correspond to those of a present-day high-end microprocessor such as the Hewlett Packard PA-8000 or Alpha 21264.

For the purpose of the experiments three different L1 cache sizes were selected: 16K, 32K, and 64K bytes and three different degrees of associativity: 1, 2 and 4. The sub-bank or sub-array size used was 4K bytes, which corresponds to the page size of the virtual memory system. The trade-off to be made when using smaller sub-bank sizes is between more leakage reduction and increased wake-up penalties. Benchmarks from the SPEC2000 suite were used, which were run on a modified SimpleScalar simulator. The benchmarks were compiled using a GCC 2.6.3 compiler using O2 level optimisations and were statically linked with library code. For each simulation a total of 1 billion instructions were run.

Figure 25A:
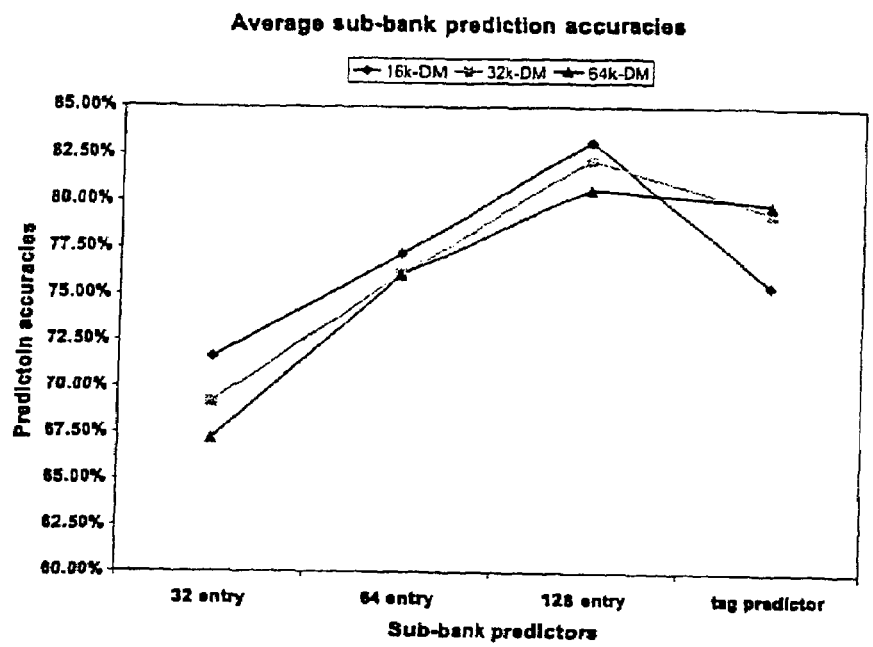
FIG. 25A is a graph of the percentage prediction accuracy against the sub-bank predictor type (32 entry, 64 entry, 128 entry and tag predictor) for each of three different direct mapped caches of different sizes.

FIG. 25A is a graph of the percentage prediction accuracy against the sub-bank predictor type (32 entry, 64 entry, 128 entry and tag predictor) for each of three different direct mapped caches of different sizes. The caches are 16 Kbyte direct-mapped (16 k-DM), 32 Kbyte direct mapped (32 k-DM) and 64 Kbyte direct mapped (64 k-DM). FIG. 24A shows that the prediction accuracy increases as the number of entries in the prediction buffers are increased. This in turn results in reduced run-time overhead compared to the base-line machines. However, prediction accuracy clearly decreases as the cache sizes increases. Assuming a fixed sub-bank size, larger caches have more sub-banks and consequently for large caches more prediction entries are required to maintain the same level of prediction accuracy. Clearly the positive effect of a larger cache still yields improved run-times.

Figure 25B:
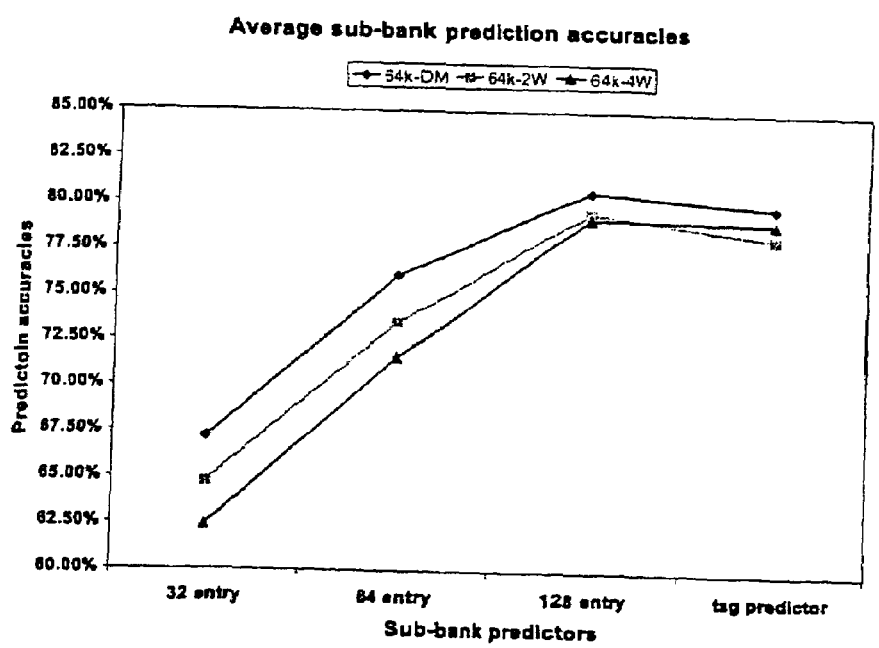
FIG. 25B is a further graph of the percentage prediction accuracy against the sub-bank predictor type (32 entry, 64 entry, 128 entry and tag predictor) for each of three different cache types.

FIG. 25B is a further graph of the percentage prediction accuracy against the sub-bank predictor type (32 entry, 64 entry, 128 entry and tag predictor) for each of three different cache types. In this case the three cache types are 64 Kbyte direct mapped (64 k-DM), 64 Kbyte two-way set-associative (64 k-2 W) and 64 Kbyte two-way set-associative (64 k-4 W). From the simulation results of FIG. 24B it can be seen that the associativity of the cache also affects prediction accuracy. In particular, as the associativity increases the prediction accuracy decreases because the correct set also needs to be predicted and awakened. For the purposes of the simulations the target set prediction was kept with the target sub-bank address in the prediction buffer entry. It will be appreciated that other different way-prediction techniques could alternatively be used. The prediction accuracy was calculated from the total correct sub-bank predictions divided by the total number of wake-ups.

From FIGS. 25A and 25B it can be seen that when prediction information is kept in cache-line tags (corresponding to "tag predictor" results on the graphs), the overall accuracy of the cache-line tag based predictor is between the 64 entry and 128 entry configurations of the sub-bank prediction buffer. There are two reasons that may account for this result: Firstly, the prediction information is lost when tag lines containing valid predictions are replaced. This causes unnecessary wake-up cycles until the prediction information is updated. This situation is avoided in the prediction buffers, where there is no direct correlation between cache entries and predictions. Secondly, each cache tag line can keep only one prediction per line whereas multiple predictions might be necessary. However, the accuracy of the cache-line tag based predictor increases as the cache size is increased because the number of the predictor entries is proportional to the number of lines. FIG. 26 is a table giving the detailed simulation results (associated with FIGS. 25A and 25B) for the sub-bank predictor accuracy of direct-mapped caches for SPEC 2000 benchmarks.

Figure 27A:
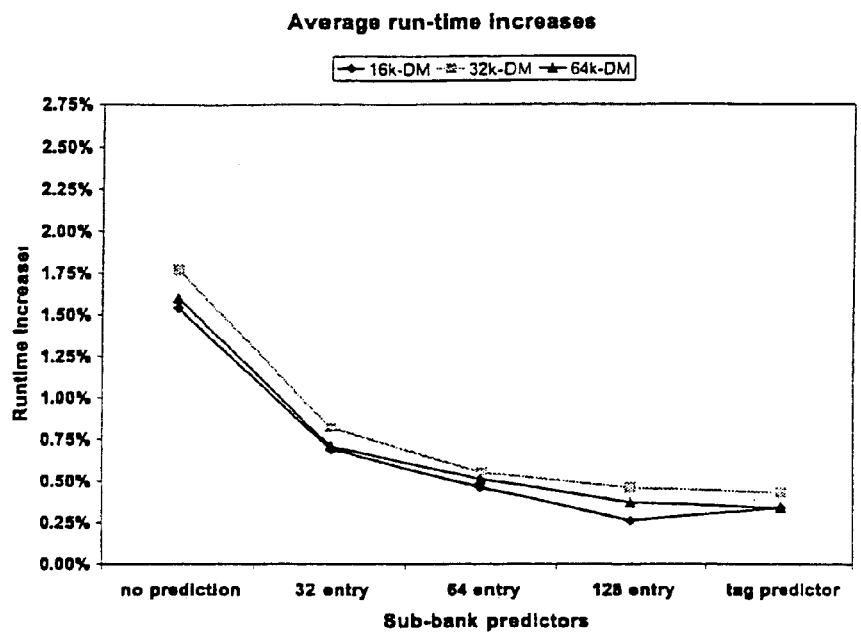
FIG. 27A is a graph of the percentage run-time increase against the sub-bank predictor type (no prediction, 32 entry, 64 entry, 128 entry and tag predictor) for each of three different direct mapped caches of different sizes.
Figure 27B:
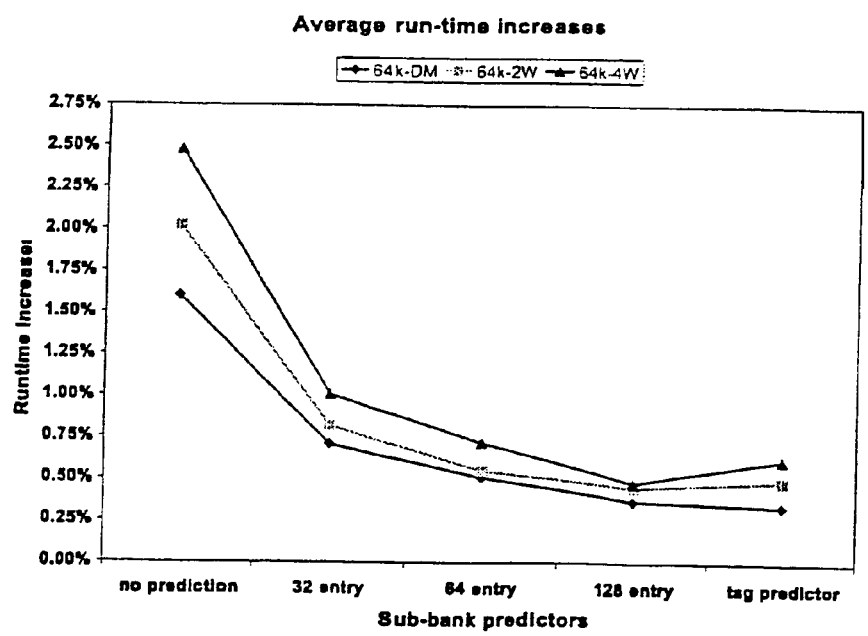
FIG. 27B is a further graph of the percentage run-time increase against the sub-bank predictor type (no prediction, 32 entry, 64 entry, 128 entry and tag predictor) for each of three 64 kbyte caches of different types.

FIG. 27A is a graph of the percentage run-time increase against the sub-bank predictor type (no prediction, 32 entry, 64 entry, 128 entry and tag predictor) for each of three different direct mapped caches of different sizes. The caches are 16 Kbyte direct mapped (16 k-DM), 32 Kbyte direct mapped (32 k-DM) and 64 Kbyte direct mapped (64 k-DM). FIG. 25B is a further graph of the percentage run-time increase against the sub-bank predictor type (no prediction, 32 entry, 64 entry, 128 entry and tag predictor) for each of three 64 kbyte caches of different types. In this case the three cache types are 64 Kbyte direct mapped (64 k-DM), 64 Kbyte two-way set-associative (64 k-2 W) and 64 Kbyte two-way set-associative (64 k-4 W). FIGS. 27A and 27B show the run-time impact with and without the sub-bank predictors when the drowsy circuit is used. The run-time increases incurred due to each of the proposed cache architectures were measured against the base-line machines and calculated according to the following equation:

$$\text{Run-time increase} = \frac{\text{No. of drowsy simulation cycles} - \text{No. of base-line simulation cycles}}{\text{No. of base-line simulation cycles}}$$

From the graph of FIG. 27A it can be seen that the prediction technique using 128 entry prediction buffer can reduce the run-time impact by 83%, 74%, and 76% for 16K, 32K, and 64K byte caches respectively compared to a cache having no sub-bank prediction at all. The runtime increase of the 64K cache is smaller than that of the 32K byte cache. However this does not mean that there more more sub-bank wake-up events in 32K byte cache machine than for the 64K byte cache. The performance of the drowsy cache is measured against the base-line machine of each cache size. In other words, the plotted results represent a relative performance against the base-line machine for the corresponding cache configuration. In addition, there are other factors that influence the performance. For example, the number of wake-up latencies that are hidden during out-of-order executions will differ according to the cache size. Table 28A of FIG. 28 is a table giving detailed experimental results (corresponding to the graphs of FIGS. 27A and 27B) for run-time increases of direct mapped caches for SPEC 2000 benchmarks.

The predictor overhead associated with achieving leakage power reduction will now be considered for each next sub-bank predictor type. Table 5 shows the required number of bits for each predictor type for a 32K byte direct-mapped cache. It can be seen from Table 5 below that the tag-based sub-bank predictor requires the same number of bits as a 64 entry prediction buffer.

TABLE 5

|  | 32 | 64 | 128 | tag |
|---|---|---|---|---|
| No. of required bits | 4096 | 8192 | 16384 | 8192 |

For example, in a 32-entry predictor, the number of required bits are 4096 bits (512 bytes), which is equivalent to 16 cache lines (32-byte per line). If we assume that the size of the cache is 64 k-bytes and the number of the cache lines is 2048 lines then the fractions of the 32, 64, and 128 entry predictors relative to the 64 k cache are just 0.78%, 1.56%, and 3.12%.

Table 28B of FIG. 28 shows leakage power reduction for SPEC2000 benchmarks when the DVS and instruction cache sub-bank prediction techniques are applied. The leakage energy reductions are measured against conventional caches.

Leakage is reduced by about 75%, 88%, and 94% in the data array for 16K, 32K and 64K byte caches consisting of 4K byte sub-banks. However, since the tag array is always active and the use of the leakage reduction technique implies extra run time, the total energy reduction is slightly smaller. When this is accounted for, the measurements showed that the average leakage energy reductions are about 68%, 80%, and 86% for 16K, 32K, and 64K byte configurations, respectively.

In summary of the experimental simulations for drowsy instruction caches, it was found that a sub-banked cache according to the present technique with the next target sub-bank predictor (i.e. where only one subbank is active and the rest of the sub-banks are in drowsy mode) can reduce the cache static power consumption by more than 86% for 64K byte caches. Furthermore, the simulation results have shown that the prediction technique using a 128 entry prediction buffer can reduce the run-time overhead by 83%, 74%, and 76% for 16K, 32K, and 64K byte caches respectively relative to the default policy where no prediction was employed. Accordingly, the combination of a DVS circuit according to the present technique with an appropriate micro-architectural mechanism provides sufficient static power savings at a modest performance impact. The present technique for reduction of leakage current has the advantage that it is simple to implement.

Figure 29:
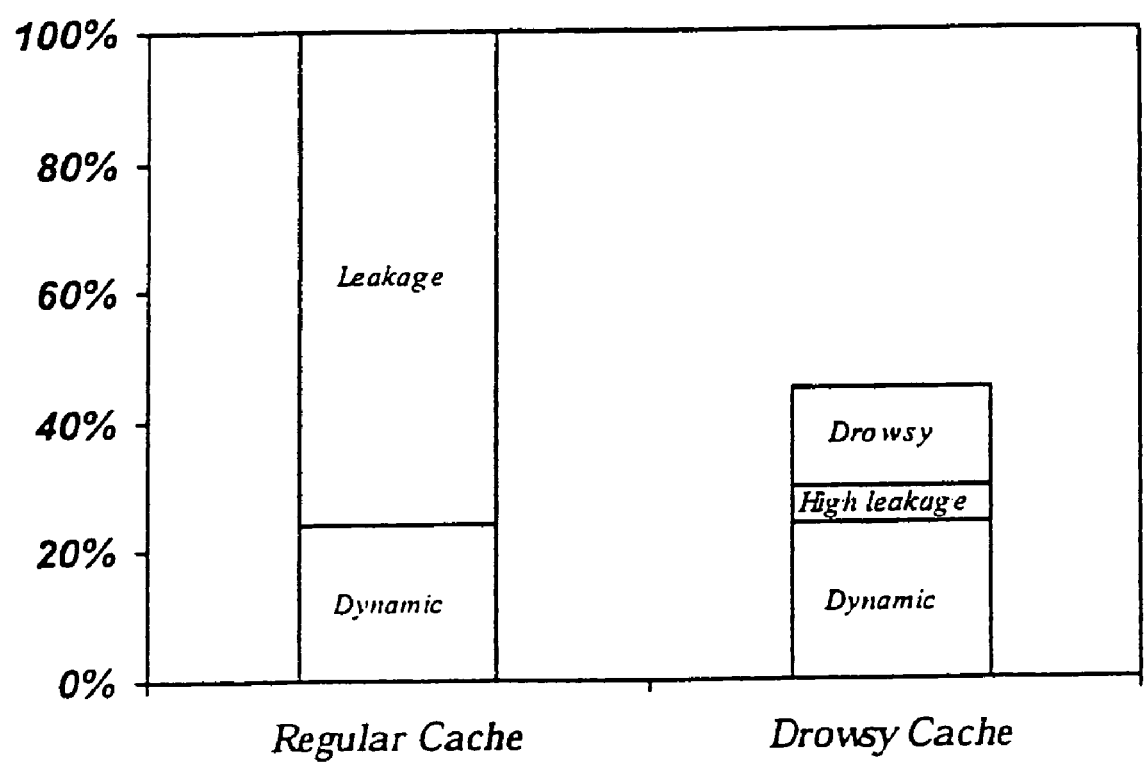
FIG. 29 schematically illustrates how different energy components vary for a regular cache and for a drowsy cache.

FIG. 29 schematically illustrates how different energy components vary for a regular cache and for a drowsy cache. In a regular cache all lines leak at a high rate whereas in the drowsy cache the high leakage component is only incurred when the line is in awake mode and is predicted to be accessed. Although leakage is not zero in drowsy mode, it can provide a six times to ten times reduction (depending on design) over the regular high-leakage mode.

Although illustrative embodiments of the invention have been described in detail herein with reference to the accompanying drawings, it is to be understood that the invention is not limited to those precise embodiments, and that various changes and modifications can be effected therein by one skilled in the art without departing from the scope and spirit of the invention as defined by the appended claims.

We claim:

1. A memory circuit comprising:
  at least one memory cell having:
  (i) a readable state in which information stored in said at least one memory cell is readable; and
  (ii) an unreadable state in which information stored in at least one memory cell is retained but unreadable, wherein static power consumption of said at least one memory cell in said unreadable state is less than static power consumption of said at least one memory cell in said readable state, said memory circuit comprising at least one memory cell array, each memory cell array having a plurality of said memory cells that are collectively settable to said readable state or said unreadable state; and
  a mode controller operable to selectively set predetermined ones of a plurality of said memory cell arrays to said unreadable state.

2. A memory circuit as claimed in claim 1, wherein at least one of a first voltage level and a second voltage level determine whether said at least one memory cell is in said readable state or in said unreadable state said first voltage level corresponds to a first supply line and said second voltage level corresponds to a second supply line.

3. A memory circuit as claimed in claim 2, wherein a transition between said readable state to said unreadable state is effected by changing said first voltage level such that it is lower in said unreadable state than in said readable state.

4. A memory circuit according to claim 2, wherein said second voltage level is set is ground level.

5. A memory circuit as claimed in claim 1, in which said memory circuit has an off-state in which stored information is lost.

6. A memory circuit as claimed in claim 5, wherein each memory cell comprises a plurality of complementary metal oxide semiconductor (CMOS) cell-transistors.

7. A memory circuit as claimed in claim 6, wherein said changing of said first voltage level to effect said transition is facilitated by connecting at least one of said memory cell arrays both to a normal voltage supply by a first CMOS transistor and to a low voltage supply by a second CMOS transistor, said first CMOS transistor and said second CMOS transistor each having a threshold voltage that is substantially higher than a threshold voltage associated with said cell transistors and said unreadable state corresponds to the connection to said low voltage supply being effective whereas said readable state corresponds to the connection to said normal voltage supply being effective.

8. A memory circuit as claimed in claim 6, wherein each of said at least one memory cell arrays is connected to a read/write line via a CMOS pass-transistor having a threshold voltage that is substantially higher than a threshold voltage associated with said cell transistors.

9. A memory circuit as claimed in claim 8, wherein at least one of a first voltage level and a second voltage level determine whether said at least one memory cell is in said readable state or in said unreadable state said first voltage level corresponds to a first supply line and said second voltage level corresponds to a second supply line, and in which a capacitance of said first supply line is substantially less than a capacitance of said pass-transistor.

10. A memory circuit as claimed in claim 6, wherein at least one of a first voltage level and a second voltage level determine whether said at least one memory cell is in said readable state or in said unreadable state said first voltage level corresponds to a first supply line and said second voltage level corresponds to a second supply line, and wherein in said unreadable state, said first voltage level is settable to be substantially 1.5 times the value of the threshold voltage associated with said cell transistors.

11. A memory circuit according to claim 1, wherein said memory circuit is a cache memory circuit and wherein said at least one memory cell array is a respective cache line.

12. A memory circuit as claimed in claim 11, wherein each cache line has an address tag that identifies data currently stored in that cache line and said address tag is extended to include at least one sub-bank predictor array element.

13. A memory circuit as claimed in claim 11, wherein each cache line has an address tag that identifies data currently stored in a respective cache line, said address tag being settable to said readable state or to said unreadable state in correspondence with a setting of the associated cache line in either said readable state or said unreadable state.

14. A memory circuit according to claim 11, comprising a voltage controller for a respective one of said cache lines.

15. A memory circuit as claimed in claim 14, wherein said voltage controller is operable to determine said second voltage of said at least one memory array in dependence upon a value of a readable-status bit associated with a respective memory array.

16. A memory circuit according to claim 1, wherein said memory circuit is a cache memory circuit having a plurality of cache sub-banks and wherein said at least one memory cell array is a respective cache sub-bank.

17. A memory circuit according to claim 16, comprising a pre-charge circuit responsive to a pre-charge signal and comprising a logic gate operable to gate said pre-charge signal with a signal for changing a cache sub-bank from said unreadable state to said readable state.

18. A memory circuit according to claim 16, comprising a sub-bank prediction buffer operable to predict which of said plurality of cache sub-banks will next be accessed after a currently active cache sub-bank and hence should next be set to said readable state.

19. A memory circuit according to claim 18, wherein each entry of said sub-bank prediction buffer comprises an instruction address of an instruction immediately prior to an instruction that leads to a change in a currently active cache sub-bank.

20. A memory circuit according to claim 16, comprising a voltage controller for a respective one of said cache sub-banks.

21. A memory circuit as claimed in claim 1, wherein said mode controller is operable to periodically reset all of said memory arrays to said unreadable state according to a predetermined reset time.

22. A memory circuit as claimed in claim 21, wherein said predetermined reset time is adaptive such that it is dependent upon a performance impact threshold.

23. A memory circuit as claimed in claim 21, wherein said mode controller is operable to set to unreadable mode only those cache lines that have not been accessed in a predetermined time window.

24. A memory circuit as claimed in claim 21, in which said mode controller is operable to calculate a performance penalty for setting each memory array to said unreadable state and is further operable to calculate said reset time in dependence upon said performance penalty.

25. A memory circuit as claimed in claim 1, wherein said at least one memory array comprises circuitry operable to prevent any accesses to a respective memory array when said memory array is in said unreadable state.

26. A memory circuit as claimed in claim 1, wherein said memory circuit is a static random access memory (SRAM) circuit and each of said at least one memory cell arrays comprises memory cells associated with a respective predetermined memory address range in SRAM.

27. A memory circuit as claimed in claim 1, wherein said memory circuit is a tightly coupled memory (TCM) circuit.

28. A memory circuit comprising:
   at least one memory cell having:
   (i) a being read state;
   (ii) a readable state in which information stored in said at least one memory cell is ready to be read in said being read state; and
   (iii) an unreadable state in which information stored in at least one memory cell is retained but is not ready to be read in said being read state; wherein static power consumption of said at least one memory cell in said unreadable state is less than static power consumption of said at least one memory cell in said readable state.

29. A memory circuit as claimed in claim 28, wherein at least one of a first voltage level and a second voltage level determine whether said at least one memory cell is in said readable state or in said unreadable state said first voltage level corresponds to a first supply line and said second voltage level corresponds to a second supply line.

30. A memory circuit as claimed in claim 29, wherein a transition between said readable state to said unreadable state is effected by changing said first voltage level such that it is lower in said unreadable state than in said readable state.

31. A memory circuit according to claim 29, wherein said second voltage level is set is ground level.

32. A memory circuit as claimed in claim 28, in which said memory circuit has an off-state in which stored information is lost.

33. A memory circuit as claimed in claim 32, wherein each memory cell comprises a plurality of complementary metal oxide semiconductor (CMOS) cell-transistors.

34. A memory circuit as claimed in claim 33, wherein said changing of said first voltage level to effect said transition is facilitated by connecting at least one of said memory cell arrays both to a normal voltage supply by a first CMOS transistor and to a low voltage supply by a second CMOS transistor, said first CMOS transistor and said second CMOS transistor each having a threshold voltage that is substantially higher than a threshold voltage associated with said cell transistors and said unreadable state corresponds to the connection to said low voltage supply being effective whereas said readable state corresponds to the connection to said normal voltage supply being effective.

35. A memory circuit as claimed in claim 33, wherein each of said at least one memory cell arrays is connected to a read/write line via a CMOS pass-transistor having a threshold voltage that is substantially higher than a threshold voltage associated with said cell transistors.

36. A memory circuit as claimed in claim 35, wherein at least one of a first voltage level and a second voltage level determine whether said at least one memory cell is in said readable state or in said unreadable state said first voltage level corresponds to a first supply line and said second voltage level corresponds to a second supply line, and in which a capacitance of said first supply line is substantially less than a capacitance of said pass-transistor.

37. A memory circuit as claimed in claim 33, wherein at least one of a first voltage level and a second voltage level determine whether said at least one memory cell is in said readable state or in said unreadable state said first voltage level corresponds to a first supply line and said second voltage level corresponds to a second supply line, and wherein in said unreadable state, said first voltage level is settable to be substantially 1.5 times the value of the threshold voltage associated with said cell transistors.

38. A memory circuit comprising:
at least one memory cell having:
(i) a readable state in which information stored in said at least one memory cell is ready to be read in a separate being read state; and
(ii) an unreadable state in which information stored in at least one memory cell is retained but is not ready to be read in a separate being read state;
wherein static power consumption of said at least one memory cell in said unreadable state is less than static power consumption of said at least one memory cell in said readable state, said memory cell comprising at least one memory cell array, each memory cell array having a plurality of said memory cells that are collectively settable to said readable state or said unreadable state.

39. A memory circuit according to claim 38, wherein said memory circuit is a cache memory circuit and wherein said at least one memory cell array is a respective cache line.

40. A memory circuit as claimed in claim 39, wherein each cache line has an address tag that identifies data currently stored in a respective cache line, said address tag being settable to said readable state or to said unreadable state in correspondence with a setting of the associated cache line in either said readable state or said unreadable state.

41. A memory circuit as claimed in claim 39, wherein each cache line has an address tag that identifies data currently stored in that cache line and said address tag is extended to include at least one sub-bank predictor array element.

42. A memory circuit according to claim 39, comprising a voltage controller for a respective one of said cache lines.

43. A memory circuit as claimed in claim 42, wherein said voltage controller is operable to determine said second voltage of said at least one memory array in dependence upon a value of a readable-status bit associated with a respective memory array.

44. A memory circuit according to claim 38, wherein said memory circuit is a cache memory circuit having a plurality of cache sub-banks and wherein said at least one memory cell array is a respective cache sub-bank.

45. A memory circuit according to claim 44, comprising a pre-charge circuit responsive to a pre-charge signal and comprising a logic gate operable to gate said pre-charge signal with a signal for changing a cache sub-bank from said unreadable state to said readable state.

46. A memory circuit according to claim 44, comprising a sub-bank prediction buffer operable to predict which of said plurality of cache sub-banks will next be accessed after a currently active cache sub-bank and hence should next be set to said readable state.

47. A memory circuit according to claim 46, wherein each entry of said sub-bank prediction buffer comprises an instruction address of an instruction immediately prior to an instruction that leads to a change in a currently active cache sub-bank.

48. A memory circuit according to claim 44, comprising a voltage controller for a respective one of said cache sub-banks.

49. A memory circuit as claimed in claim 38, comprising a mode controller operable to selectively set predetermined ones of a plurality of said memory cell arrays to said unreadable state.

50. A memory circuit as claimed in claim 49, wherein said mode controller is operable to periodically reset all of said memory arrays to said unreadable state according to a predetermined reset time.

51. A memory circuit as claimed in claim 50, wherein said predetermined reset time is adaptive such that it is dependent upon a performance impact threshold.

52. A memory circuit as claimed in claim 50, wherein said mode controller is operable to set to unreadable mode only those cache lines that have not been accessed in a predetermined time window.

53. A memory circuit as claimed in claim 50, in which said mode controller is operable to calculate a performance penalty for setting each memory array to said unreadable state and is further operable to calculate said reset time in dependence upon said performance penalty.

54. A memory circuit as claimed in claim 38, wherein said at least one memory array comprises circuitry operable to prevent any accesses to a respective memory array when said memory array is in said unreadable state.

55. A memory circuit as claimed in claim 38, wherein said memory circuit is a static random access memory (SRAM) circuit and each of said at least one memory cell arrays comprises memory cells associated with a respective predetermined memory address range in SRAM.

56. A memory circuit as claimed in claim 38, wherein said memory circuit is a tightly coupled memory (TCM) circuit.

* * * * *